US 6,946,330 B2

(12) United States Patent
Yamazaki et al.

(10) Patent No.: US 6,946,330 B2
(45) Date of Patent: Sep. 20, 2005

(54) DESIGNING METHOD AND MANUFACTURING METHOD FOR SEMICONDUCTOR DISPLAY DEVICE

(75) Inventors: Shunpei Yamazaki, Atsugi (JP); Mai Akiba, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 23 days.

(21) Appl. No.: 10/267,555

(22) Filed: Oct. 10, 2002

(65) Prior Publication Data

US 2003/0071303 A1 Apr. 17, 2003

(30) Foreign Application Priority Data

Oct. 11, 2001 (JP) ........................................ 2001-313931

(51) Int. Cl.[7] .............................................. H01L 21/84
(52) U.S. Cl. ...................... 438/130; 438/149; 438/151; 438/158; 438/598
(58) Field of Search ................................ 438/128, 130, 438/149, 151, 158, 598, 637, 672, 675

(56) References Cited

U.S. PATENT DOCUMENTS

| | | |
|---|---|---|
| 5,247,190 A | 9/1993 | Friend et al. |
| 6,031,249 A | 2/2000 | Yamazaki et al. |
| 6,069,373 A | 5/2000 | Iwaki |

(Continued)

FOREIGN PATENT DOCUMENTS

| | | |
|---|---|---|
| EP | 1 017 108 | 7/2000 |
| EP | 1 207 511 | 5/2002 |
| JP | 07-130971 | 5/1995 |

(Continued)

OTHER PUBLICATIONS

H. Asada et al., "A 2.7 in. 1.3MPixel Driver–Integrated Poly–Si TFT–LCD for Multimedia Projectors," 1996 IEEE International Solid–State Circuits Conference, Digest of Technical Papers, pp. 190–191, 442 (1996).*
M. Ito, *Approach to System Integration by Low Temperature Poly–Crystalline SI Toward 2000*, Nikkei Microdevices, Feb., 1997, pp. 90–95.
Author Unknown, *Low Temperature Poly–Crystalline Si for Challenging the Large–Scale Investment*, Nikkei Microdevices, Jun., 1998, pp. 118–129.
I. Washizuka, *Suggestion of Ideal Liquid Crystal Business and Appliances for the 21$^{st}$ Century*, Nikkei Microdevices, Dec. 1998, pp. 175–180.
Offical Action of Aug. 31, 2004 for JP 2001–313931, JPO.
H. Schenk et al., "Polymers for Light Eitting Diodes," Euro DIsplay Proceedings 1999, pp. 33–37.

*Primary Examiner*—Stephen W. Smoot
(74) *Attorney, Agent, or Firm*—Eric J. Robinson; Robinson Intellectual Property Law Office, P.C.

(57) ABSTRACT

Irrespective of a specification of the controller, a plurality of TFTs are formed for the controller on a substrate in advance. Then, in accordance with a design of the controller, connection is achieved among sources, drains, and gates, which serve as three terminals in each of the plural TFTs, appropriately through a wiring formed on a layer different from the one where the plural TFTs are formed, so that the controller with a desired specification is formed. At this time, it is not required to use all the TFTs arranged on the substrate and some TFTs may remain unused depending on the specification of the controller.

13 Claims, 21 Drawing Sheets

U.S. PATENT DOCUMENTS

| | | | |
|---|---|---|---|
| 6,147,667 A | 11/2000 | Yamazaki et al. | |
| 6,271,818 B1 | 8/2001 | Yamazaki et al. | |
| 6,278,132 B1 | 8/2001 | Yamazaki et al. | |
| 6,287,944 B1 | 9/2001 | Hara et al. | |
| 6,563,482 B1 | 5/2003 | Yamazaki et al. | |
| 6,566,754 B2 | 5/2003 | Hara et al. | |
| 6,582,980 B2 * | 6/2003 | Feldman et al. | 438/28 |
| 6,605,497 B2 | 8/2003 | Yamazaki et al. | |
| 6,801,180 B2 | 10/2004 | Matsueda | |
| 2001/0046755 A1 | 11/2001 | Hara et al. | |
| 2001/0048115 A1 | 12/2001 | Yamazaki et al. | |
| 2002/0011983 A1 | 1/2002 | Yamazaki et al. | |
| 2002/0017681 A1 * | 2/2002 | Inoue et al. | 257/315 |
| 2002/0040981 A1 | 4/2002 | Yamazaki et al. | |
| 2002/0071064 A1 * | 6/2002 | Moon | 349/43 |
| 2002/0127753 A1 * | 9/2002 | Jang | 438/29 |
| 2002/0158855 A1 * | 10/2002 | Matsueda | 345/204 |
| 2003/0193494 A1 | 10/2003 | Yamazaki et al. | |
| 2003/0211669 A1 | 11/2003 | Yamazaki et al. | |

FOREIGN PATENT DOCUMENTS

| | | |
|---|---|---|
| JP | 07-168154 | 7/1995 |
| JP | 10-051005 | 2/1998 |
| JP | 10-079516 | 3/1998 |
| JP | 10-079517 | 3/1998 |
| JP | 10-092576 A | 4/1998 |
| JP | 10-197897 | 7/1998 |
| JP | 11-008319 | 1/1999 |
| JP | 11-121760 | 4/1999 |
| JP | 2000-114546 | 4/2000 |
| JP | 2000-156346 | 6/2000 |
| JP | 2000-243974 | 9/2000 |
| JP | 2000-353811 | 12/2000 |
| JP | 2001-092426 | 4/2001 |
| JP | 2001-244465 | 9/2001 |
| JP | 2001-250775 | 9/2001 |
| JP | 2001-274085 | 10/2001 |
| WO | WO 01/73738 | 10/2001 |

* cited by examiner

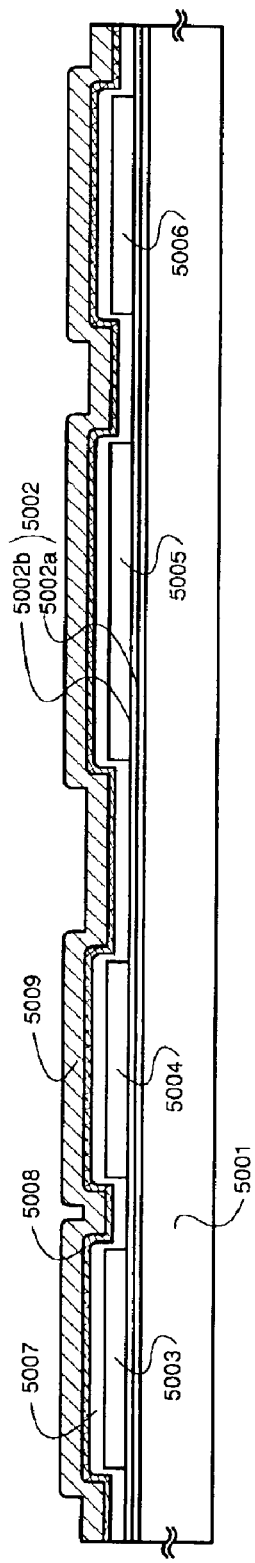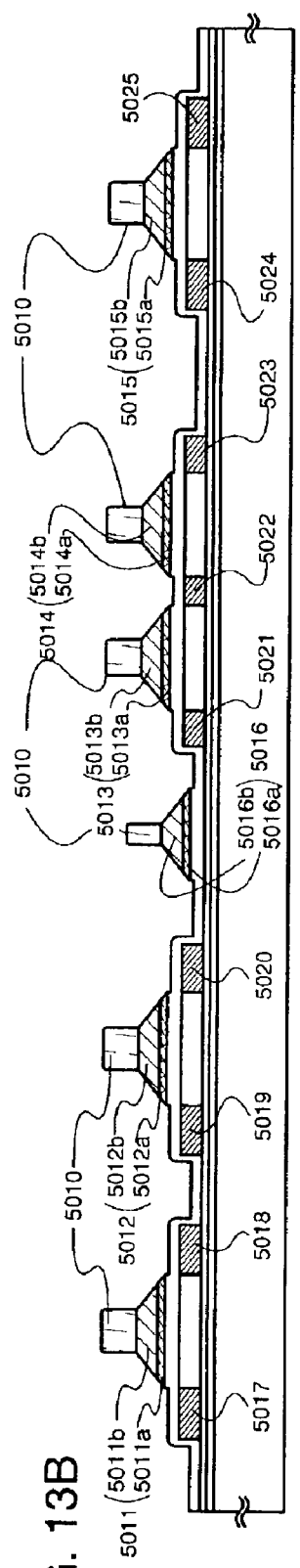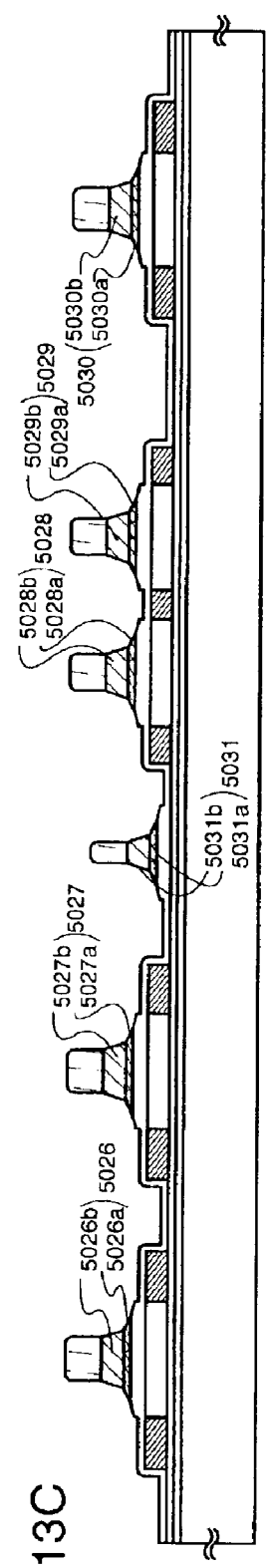

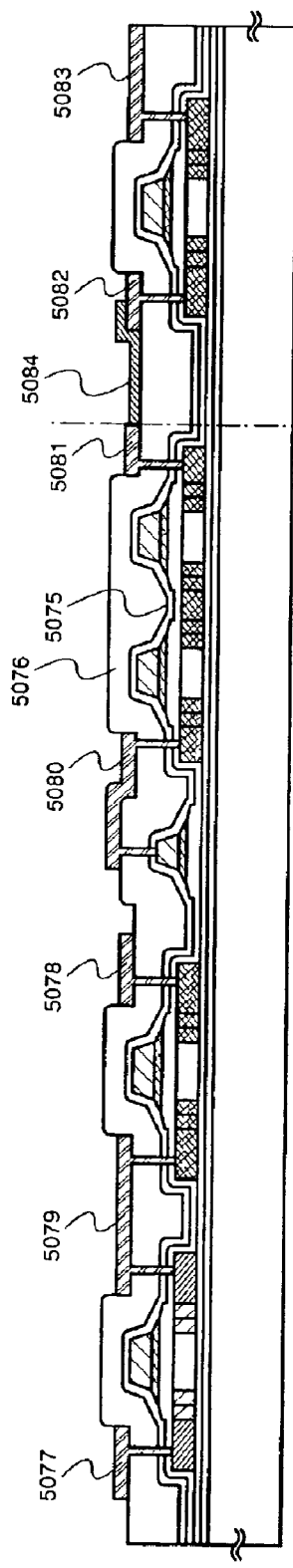
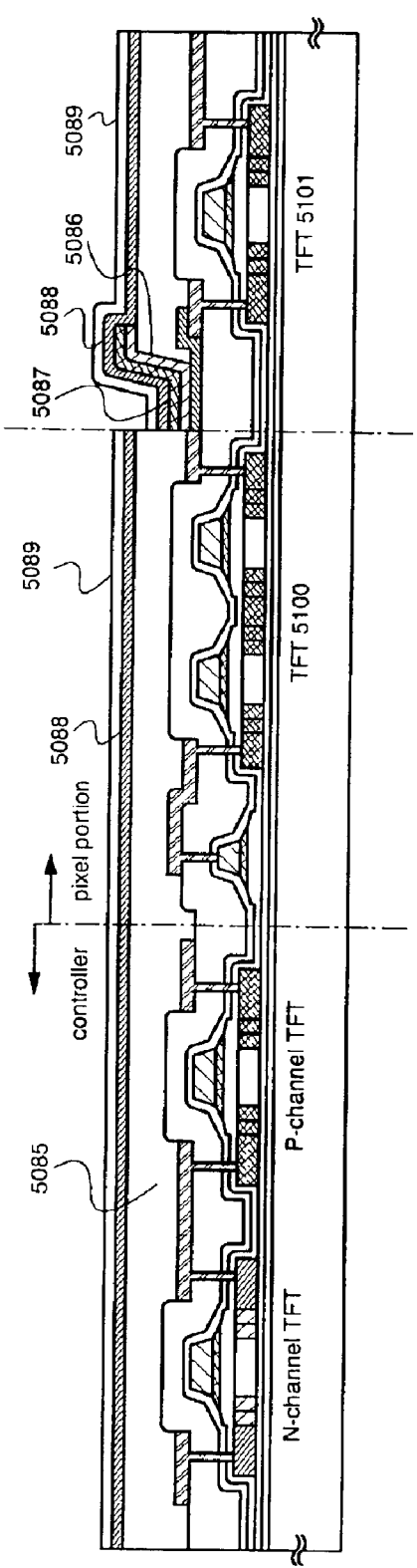
FIG. 15A
FIG. 15B

DESIGNING METHOD AND MANUFACTURING METHOD FOR SEMICONDUCTOR DISPLAY DEVICE

BACKGROUND OF THE INVENTION

1. Field of the Invention

The present invention is relates to that a design method and a manufacturing method of the semiconductor display device, the semiconductor display device manufactured by using said manufacturing method, and an order receiving system of the semiconductor display device manufactured by using said manufacturing method.

2. Related Arts

In recent years, a technology of forming the TFT on a glass substrate is advanced rapidly, and an application of the technology to an active matrix type semiconductor device is developed. Especially, the TFT using a poly-crystalline silicon film (poly-Si TFT) has higher field effect mobility than the conventional TFT using an amorphous film, and is possible to be fast operated. Therefore, by using the poly-Si TFT, the system on glass can be realized that the driver circuit and the controller are integrated on the glass substrate together with the pixel portion.

The driver circuit of the semiconductor display device is formed on a silicon substrate so far, and connected to a pixel portion of the display device via the FPC or the like. However, if IC is connected to the glass substrate on which the pixel portion is formed through the FPC, the problem that the connection portion thereof is weak against the physical shock is occurred. This defect is detected more as there are many wirings of the FPC. In order to avoid the certain problems, the number of FPC wiring is restrained by that the driver circuit is formed together with the pixel portion on the glass substrate, and thereby the size of the display device can be reduced.

For example, in the case that the active matrix type liquid crystal display device that is one of the semiconductor devices, it has generally the scanning line that selects in sequence one or several pixels among the plural pixels in the pixel portion and the signal line driver circuit that input a signal (video signal) having an image information to a selected pixel. Forming said driver circuit on the glass substrate together with the pixel portion, the liquid crystal display device can be enhanced the resistance property against the physical shock, and thereby the size of the liquid crystal display device can be reduced.

In addition, in recent years, the controller that is formed on the silicon substrate until now is tried to form on the glass substrate as well as the driver circuit. If the controller and the driver circuit can be formed on the same glass substrate together with the pixel portion, the size of the semiconductor device can be reduced dramatically, and the resistance property against the physical shock can be more enhanced.

However, the controller has functions of generating signals that determines a timing of the operation of the driver circuit and the pixel portion, and processing a constant standard video signal from external video source adjusting to the specification of the driver circuit and the pixel portion, and the driver method of the semiconductor display device. Therefore, it is necessary that the design of the controller should be changed in each case according to the standard, the specification, and the driver method of the semiconductor device.

For example, if there is a necessity of changing design of the controller to manufacture various prototypes, or changing design of the controller for each customer, all masks should be changed including the pixel portion and the driver circuit in each time in case of forming the controller together with the driver circuit and the pixel portion on the glass substrate. Thereby, it is difficult to reduce the manufacturing cost of the semiconductor display device.

Especially in recent years, there is a tendency to large item small scale production of the semiconductor device because the device is used in display portions of various electronic apparatuses. Accordingly, it is expected that the problem is occurred that increasing costs with the above-mentioned design change of the controller if the controller is formed together with the driver circuit and the pixel portion on the glass substrate.

SUMMARY OF THE INVENTION

In view of the aforementioned problems, an object of the present invention is therefore to devise a design method of the semiconductor device equipped with a semiconductor device for a particular application that can reduce a cost with the design change of the controller, and to devise a order receiving system of the semiconductor device formed by using said design method.

The inventors of the present invention have made study to realize a design of a controller using a TFT as in an ASIC (application specific integrated circuit). As a result, a designing method of the present invention is completed. According to the present invention, irrespective of a specification of the controller, a plurality of TFTs for a controller are formed on a substrate in advance. Then, in accordance with a design of the controller, connection is achieved among sources, drains, and gates, which serve as three terminals in each of the plural TFTs, appropriately through a wiring formed on a layer different from a layer where the plural TFTs are formed, thereby forming a controller with a desired specification. At this time, it is unnecessary to use all the TFTs arranged on the substrate and some TFTs may remain unused depending on the specification of the controller.

Further, the number of the plural TFTs is required to be set to allow the free design of the controller, for each size and each polarity. As the TFTs are increased for each size and each polarity, a variety of designs are achieved, so that it is possible to manufacture the controller corresponding to semiconductor display devices of the various specifications. On the contrary, when the number of the TFTs excessively increases, the number of the TFTs that are not used for the controller is increased. As a result, it becomes difficult to reduce the semiconductor display device in size. Accordingly, the number of the TFTs formed for the controller on the substrate, and the size and polarity thereof may be set appropriately by a designer while considering a balance therebetween.

Also, in some of the above-mentioned TFTs, it is possible that an active layer and a gate are connected to each other in advance as one unit (basic cell) and a plurality of basic cells are formed. Then, connection is attained among the sources, the drains and the gates in the respective TFTs of the basic cell through the wirings, so that a variety of logic elements may be formed using the basic cell and the controller may be designed using the logic elements in combination.

In addition to the above structure, a variety of logic elements formed by connecting the active layer and the gate in some TFTs are formed on the substrate in advance. Then, the terminals of the respective logic elements are connected appropriately through the wirings formed on a layer different from the one where the TFTs of the logic elements are formed, and thus the controller of the desired specification may be formed.

According to the above structure, when the specification of the controller is changed, it is enough to change only a design of the wirings connecting the TFTs or the logic elements formed in advance, so that at least two masks: a mask for patterning the wiring; and a mask for a contact hole of the wiring may be changed. Therefore, it is possible to reduce a cost associated with a design change of the controller and also to manufacture the controllers of the various specifications.

Also, in the semiconductor display device, in the case where although the specifications of a pixel portion and a driver circuit are determined, the specification of the controller corresponding to those of the pixel portion and the driver circuit has not been determined yet, it is possible to previously manufacture portions corresponding to the TFTs or circuit elements except the wirings. Thereafter, according to a specification of a controller ordered from a client, the wirings connecting the respective TFTs or the circuit elements are designed to be manufactured, so that the controller of the desired specification can be manufactured. Thus, at a stage where the specification of the controller is not determined, it is possible to start manufacturing the semiconductor display device, and therefore a TAT (turn around time) that is a period started with the reception of the order from the client and ended with a delivery of the product to the client can be reduced. As a result, it is possible to improve the service to the client.

Note that, the present invention is not limited to the designing method for the controller, but is also applicable to a design of the driver circuits including a signal line driver circuit and a scanning line driver circuit.

BRIEF DESCRIPTION OF THE DRAWINGS

In the accompanying drawings:

FIGS. 13A to 13C are views for illustrating a manufacturing method of a light emitting device of the present invention;

FIGS. 15A and 15B are views for illustrating a manufacturing method of a light emitting device of the present invention;

DETAILED DESCRIPTION OF THE PREFERRED EMBODIMENTS

Hereinafter, a designing method for a semiconductor display device of the present invention will be described.

Figure 1A:
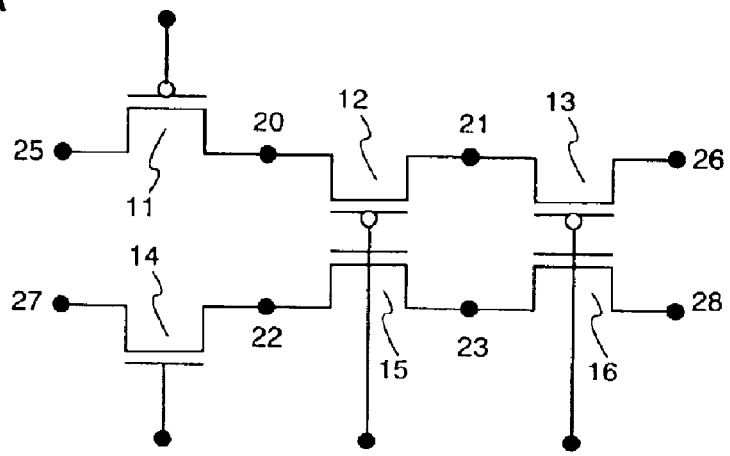
FIGS. 1A to 1C are views for showing a circuit diagram of a basic cell and D flip flop.

FIG. 1A shows an example of a basic cell formed by connecting an active layer and a gate in some TFTs. The basic cell shown in FIG. 1A consists of three p-channel TFTs 11, 12, and 13 and three n-channel TFTs 14, 15, and 16.

The three p-channel TFTs 11, 12, and 13 are connected in series. That is, one of a source and a drain of the p-channel TFT 12 is connected to a source/drain of the p-channel TFT 11 and the other thereof is connected to a source/drain of the p-channel TFT 13.

Note that, in this specification, the term connection refers to an electrical connection, unless otherwise specified.

Also, the three n-channel TFTs 14, 15, and 16 are connected in series. That is, one of a source and a drain of the n-channel TFT 15 is connected to a source/drain of the n-channel TFT 14 and the other thereof is connected to a source/drain of the n-channel TFT 16.

Then, the gate of the p-channel TFT 12 and that of the n-channel TFT 15 are connected to each other. Also, the gate of the p-channel TFT 13 and that of the n-channel TFT 16 are connected to each other.

Note that, for convenience of description, in FIG. 1A, a node at which the p-channel TFTs 11 and 12 are connected and a node at which the p-channel TFTs 12 and 13 are connected are hereafter denoted by reference numerals 20 and 21, respectively. Further, a node at which the n-channel TFTs 14 and 15 are connected and a node at which the n-channel TFTs 15 and 16 are connected are denoted by reference numerals 22 and 23, respectively.

Then, one terminal of the source and the drain in the p-channel TFT 11, which is not connected to the node 20 is denoted by reference numeral 25. One terminal of the source and the drain in the p-channel TFT 13, which is not connected to the node 21 is denoted by reference numeral 26. One terminal of the source and the drain in the n-channel TFT 14, which is not connected to the node 22 is denoted by reference numeral 27. One terminal of the source and the drain in the n-channel TFT 16, which is not connected to the node 23 is denoted by reference numeral 28.

Figure 2A:
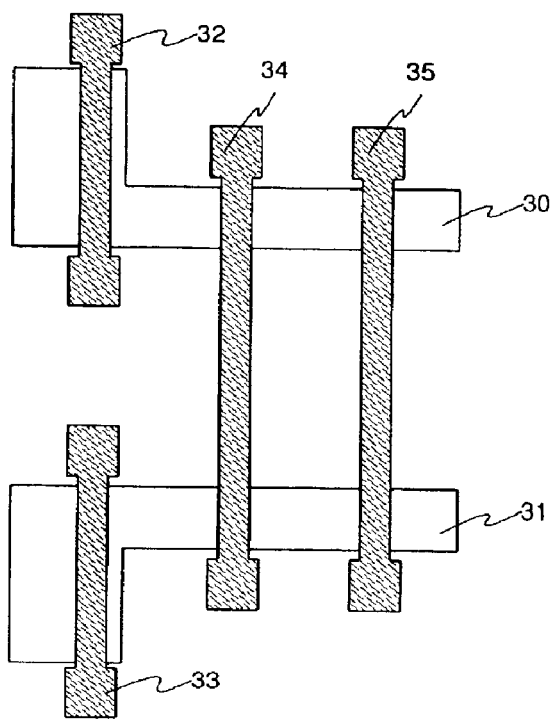
FIGS. 2A and 2B are views for showing top views of a basic cell and D flip flop.

FIG. 2A is a top view of the basic cell of FIG. 1A. The p-channel TFTs 11, 12 and 13 have an active layer 30 in common. The n-channel TFTs 14, 15, and 16 have an active layer 31 in common. Wirings 32, 34, and 35 overlap the active layer 30 with a gate insulating film (not shown) interposed therebetween, the gate insulating film being in contact with the active layer 30. Also, wirings 33, 34, and 35 overlap the active layer 31 with a gate insulating film (not shown) interposed therebetween, the gate insulating film being in contact with the active layer 31. Here, the wirings 32 to 35 serve as gates in a portion where they overlap the active layer 30 or 31. Hereinafter, the wirings 32 to 35 which partially serve as gates of the TFTs are each referred to as a gate wiring in order to distinguish them from the wirings for forming the logic elements described below.

Portions overlapping the active layer 30 of the gate wirings 32, 34, and 35 serve as gates of the p-channel TFTs 11, 12, and 13, respectively.

Portions overlapping the active layer 31 of the gate wirings 33, 34, and 35 serve as gates of the n-channel TFTs 14, 15, and 16, respectively.

Next, a description will be made of an example in which a D-flip-flop circuit is composed of the above-mentioned basic cells. The terminals and the nodes of the basic cells shown in FIG. 1A and FIG. 2A are appropriately connected through the wirings formed in a layer different from a layer where the active layers and the gates are formed, thereby forming the D flip flop.

Figure 1B:
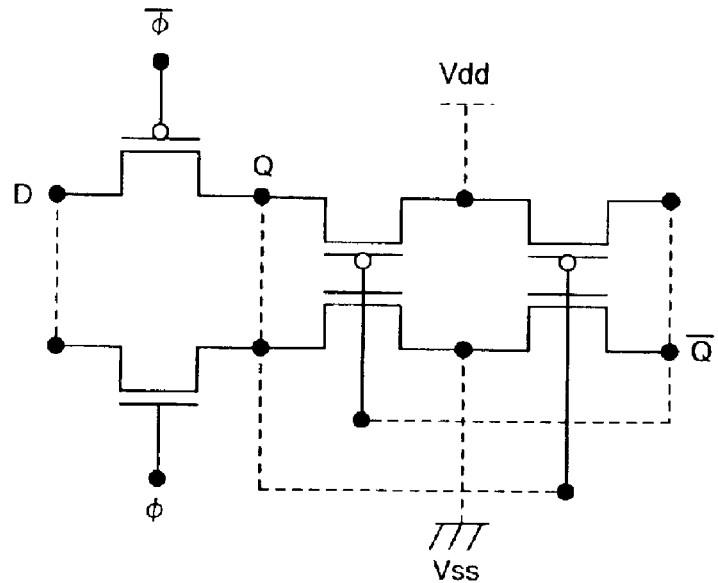

FIG. 1B is a circuit diagram showing the D flip flop formed based on the basic cells of FIG. 1A. In FIG. 1B, the terminals 25 and 27 are connected to each other in the basic cells of FIG. 1A. Further, the nodes 20 and 22 are connected to the gates of the p-channel TFT 13 and the n-channel TFT 16. The terminals 26 and 28 are connected to the gates of the p-channel TFT 12 and the n-channel TFT 15. A voltage Vdd is applied to the node 21, whereas a voltage Vss is applied to the node 23. Here, Vdd>Vss.

Figure 1C:
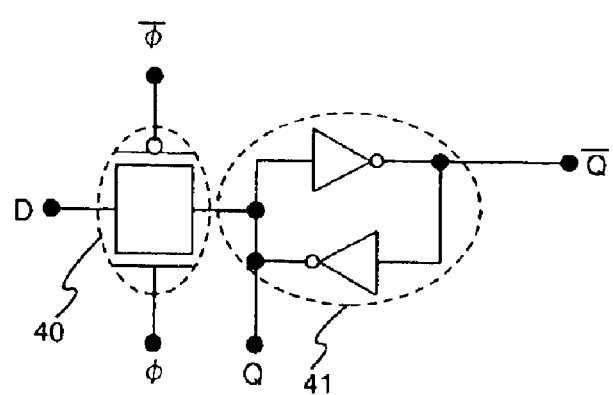

FIG. 1C is an equivalent circuit diagram of FIG. 1B. As seen from FIG. 1C, a transmission gate 40 and a flip-flop circuit 41 are provided.

Figure 2B:
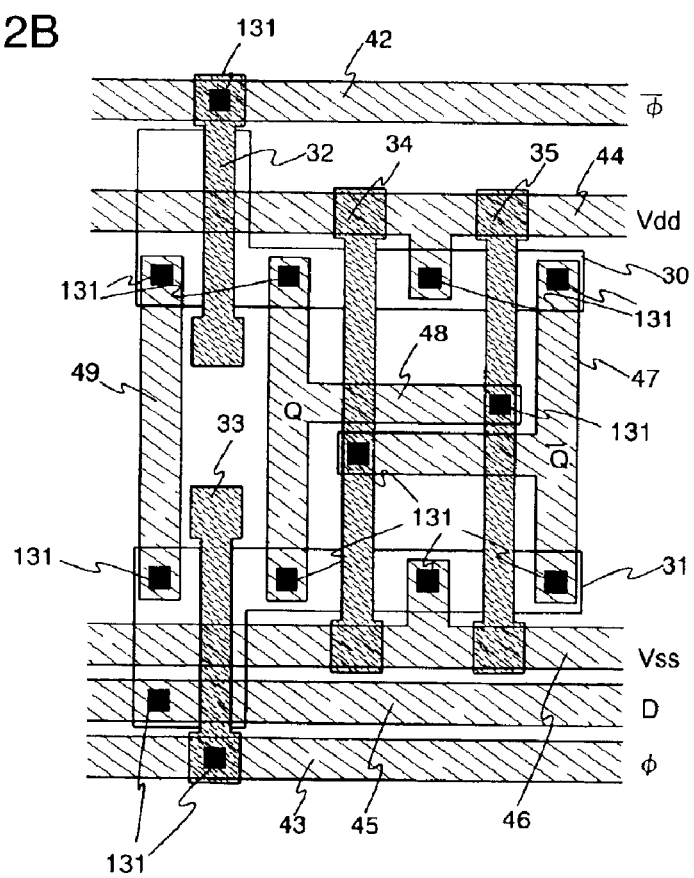

FIG. 2B is a top view of the D flip flop of FIG. 1B. An interlayer insulating film (not shown) is formed so as to cover the active layers 30, 31, the gate wirings 32 to 35, and the gate insulating film (not shown). Then, on the interlayer insulating film, wirings 42 to 49 are formed in contact with the active layers 30, 31 and the gate wirings 32 to 35 through contact holes formed in the interlayer insulating film and the gate insulating film.

In FIG. 2B, reference numeral 131 denotes a contact portion.

Specifically, the wiring 42 is in contact with the gate wiring 32 and the wiring 43 is in contact with the gate wiring 33.

The wiring 44 is in contact with the active layer 30 in a region between a portion where the active layer 30 overlaps the gate wiring 34 and a portion where the active layer 30 overlaps the gate wiring 35. Also, the wiring 46 is in contact with the active layer 31 in a region between a portion where the active layer 31 overlaps the gate wiring 34 and a portion where the active layer 31 overlaps the gate wiring 35.

The wiring 49 is in contact with the active layer 30 in one region where the active layer 30 is divided into two regions across the portion where the active layer 30 overlaps the gate wiring 32, the other region thereof overlapping the other wirings. Further, the wiring 49 is in contact with the active layer 31 in one region where the active layer 31 is divided into two regions across the portion where the active layer 31 overlaps the gate wiring 33, the other region thereof overlapping the other wirings.

The wiring 47 is in contact with the active layer 30 in one region where the active layer 30 is divided into two regions across the portion where the active layer 30 overlaps the gate wiring 35, the other region thereof overlapping the other wirings. Further, the wiring 47 is in contact with the active layer 31 in one region where the active layer 31 is divided into two regions across the portion where the active layer 31 overlaps the gate wiring 35, the other region thereof overlapping the other wirings. Furthermore, the wiring 47 is in contact with the gate wiring 34.

The wiring 48 is in contact with the gate wiring 35. Further, the wiring 48 is in contact with the active layer 30 in a region between a portion where the active layer 30 overlaps the gate wiring 32 and a portion where the active layer 30 overlaps the gate wiring 34. Furthermore, the wiring 48 is in contact with the active layer 31 in a region between a portion where the active layer 31 overlaps the gate wiring 33 and a portion where the active layer 31 overlaps the gate wiring 34.

Also, the wiring 45 is in contact with the active layer 31 in one region where the active layer 31 is divided into two regions across the portion where the active layer 31 overlaps the gate wiring 33, the other region thereof overlapping the other wirings.

In this way, according to a design of FIG. 2B, the wirings 42 to 49 are manufactured to thereby manufacture the D-flip-flop circuit as shown in FIG. 2B.

Note that, in this embodiment mode, an example has been described in which the D-flip-flop circuit is composed of the basic cells of FIG. 1A and FIG. 2A, but the present invention is not limited to this circuit configuration. The configuration of the basic cell is not limited to those shown in FIG. 1A and FIG. 2A, and it can be appropriately designed by a designer. Further, the circuit or logic element formed based on the basic cells is not limited to the D-flip-flop circuit, and other circuits or logic elements can be also manufactured. At this time, it is not required to use all the TFTs formed in the basic cells for designing the circuit or logic element, and thus only a part of the TFTs of the basic cells may be used for forming the circuit or logic element. Moreover, the basic cells with the configuration as shown in FIG. 1A and FIG. 2A and various basic cells with other configurations are formed on the substrate in advance and the basic cells with the various configurations may be used to form the logic element or circuit.

With the above-mentioned structure, in the present invention, when the specification of the controller is changed, it is enough to change only the design of wirings connecting the TFTs or logic elements formed in advance and the design of the contact hole. Therefore, only the change of two masks suffices therefor. Accordingly, it is possible to reduce the cost associated with the design change of the controller and also to manufacture the controller of the various specifications. Further, the present invention is not limited to the designing method for the controller, but is applicable to a design of driver circuits including a signal line driver circuit and a scanning line driver circuit as well.

Figure 3:
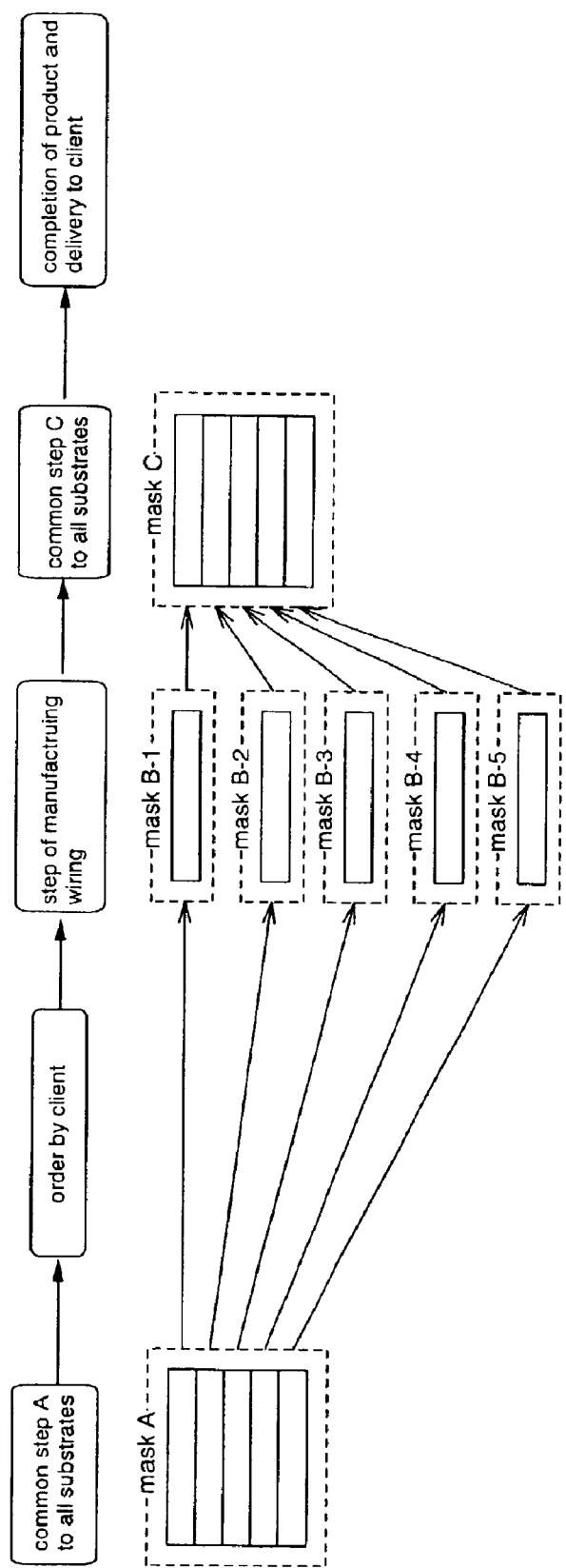
FIG. 3 is a view for showing flow chart of an order receiving system of the present invention.

Next, a description will be made of an order receiving system for the semiconductor display device of the present invention by use of the above-mentioned designing method with reference to a flow chart of FIG. 3.

First, step A is performed on all substrates using a mask A in common. Step A common to all substrates includes whole steps up to a step of forming an interlayer insulating film covering the TFT. A typical example thereof includes formation of an active layer, crystallization of the active layer, formation of a gate insulating film, addition of an impurity to the active layer, formation of a gate, formation of an interlayer insulating film, or the like.

Step A common to all substrates as described above is completed before waiting for a client to order. When a specification of a controller is determined according to the order from the client, the contact holes are then formed in the interlayer insulating film and the gate insulating film in association with a design of the controller, and wirings are formed in contact with a source, a drain, or a gate of each TFT.

The wirings are manufactured using masks (B-1, B-2, B-3, B-4, and B-5) different from each other, which are formed in accordance with the design of the controller of each substrate.

Next, step C common to all substrates is performed again, in which whole steps after forming the wirings using the different masks for each substrate are conducted. In a case of a liquid crystal display device, for example, step C includes formation of an interlayer insulating film, formation of a pixel electrode, bonding to an opposing substrate, injection of liquid crystal, and other steps. In a case of a light emitting device using an OLED (organic light emitting device), step C includes formation of an interlayer insulating film, formation of a pixel electrode, formation of an organic light emitting layer, formation of a cathode, formation of a protective film, sealing of a substrate, and other steps.

The OLED consists of a layer (hereinafter, referred to as an organic light emitting layer), an anode layer, and a cathode layer, the organic light emitting layer including an organic compound (organic light emitting material) where luminescence (electroluminescence) generated through an application of electric field is obtained. The luminescence obtained from the organic compound is classified into light emission upon return to a base state from singlet excitation (fluorescence) and light emission upon return to the base state from triplet excitation (phosphorescence). The light emitting device of the present invention may use one or both of the above light emissions.

Note that, in this specification, all of the layers provided between the anode and the cathode in the OLED are collectively defined as the organic light emitting layer. Specifically, the organic light emitting layer includes a light emitting layer, a hole injection layer, an electron injection layer, a hole transportation layer, an electron transportation layer, or the like. As a basic structure of the OLED, the anode, the light emitting layer, and the cathode are laminated in the stated order. In addition to the structure, there is employed in some cases a structure in which the anode, the hole injection layer, the light emitting layer, and the cathode are laminated in the stated order, or a structure in which the anode, the hole injection layer, the light emitting layer, the electron transportation layer, and the cathode are laminated in the stated order.

When step C common to all substrates is ended, the semiconductor display device is completed as a product to be delivered to the client.

According to the order receiving system, in the semiconductor display device, in the case where the specifications of a pixel portion and a driver circuit are determined, the specification of the controller corresponding to those of the pixel portion and the driver circuit has not been determined yet, it is possible to previously manufacture portions corresponding to the TFTs or circuit elements except the wirings. Thus, in a period from reception of the order concerning a specification of the controller from the client until completion of the semiconductor display device, a period necessary for steps before manufacturing the wirings is not included. Therefore, the TAT (turn around time) that is a period started with the reception of the order from the client and ended with a delivery of the product to the client can be reduced. As a result, it is possible to improve the service to the client.

Hereinafter, embodiments of the present invention will be described.

[Embodiment 1]

In this embodiment, a description is made of an example in which the terminals and the nodes of the basic cells shown in FIG. 1A and FIG. 2A are connected appropriately through the wirings formed in a layer different from a layer where the active layers and the gates are formed to thereby attain NAND.

Figure 4A:
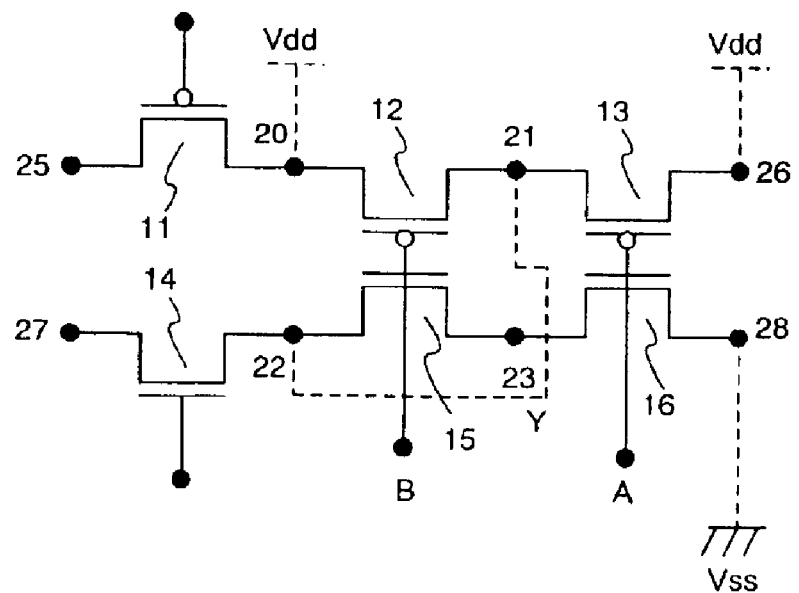
FIGS. 4A and 4B are views for showing a circuit diagram of NAND formed by using a basic cell shown in FIG. 1.

FIG. 4A is a circuit diagram showing a NAND circuit formed based on the basic cells of FIG. 1A. In FIG. 4A, the nodes 21 and 22 in the basic cells of FIG. 1A are connected to each other. Also, the voltage Vdd is applied to the node 20 and the terminal 26, whereas the voltage Vss is applied to the terminal 28. Here, Vdd>Vss.

Figure 4B:
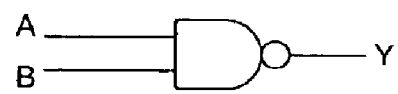

FIG. 4B is an equivalent circuit diagram of FIG. 4A.

Figure 5:
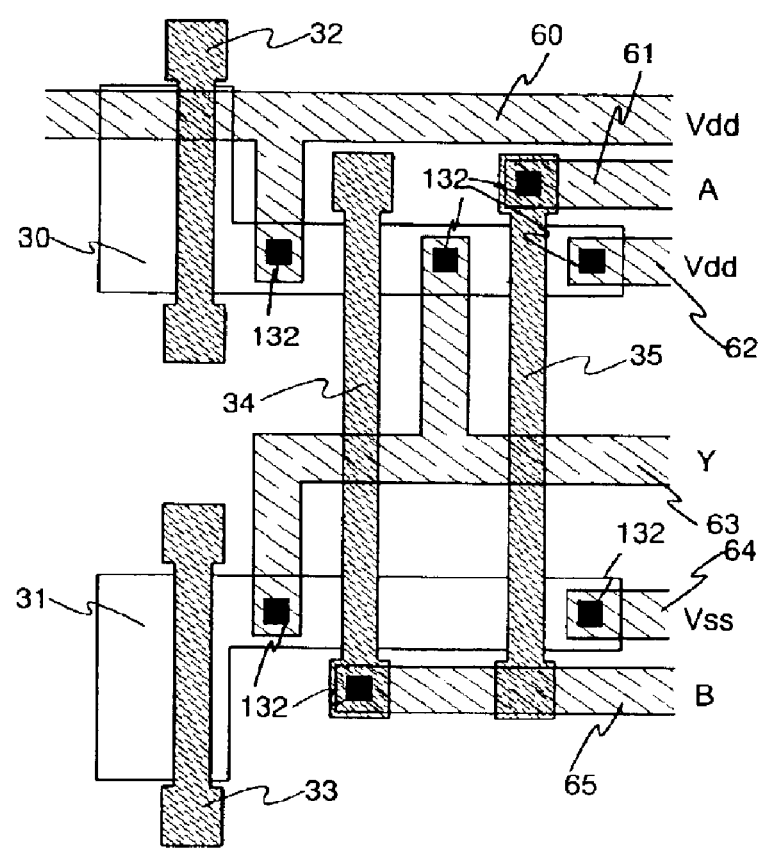
FIG. 5 is view for showing a top surface view of NAND formed by using a basic cell shown in FIG. 1.

FIG. 5 is a top view of the NAND circuit of FIG. 4A. An interlayer insulating film (not shown) is formed so as to cover the active layers 30, 31, the gate wirings 32 to 35, and the gate insulating film (not shown). Then, on the interlayer insulating film, wirings 60 to 65 are formed in contact with any of the active layers 30, 31 and the gate wirings 32 to 35 through contact holes formed in the interlayer insulating film and the gate insulating film.

In FIG. 5, reference numeral 132 denotes a contact portion.

Specifically, the wiring 60 overlaps the active layer 30 in one region where the active layer 30 is divided into two regions across a portion where the active layer 30 overlaps the gate wiring 34, the other region thereof overlapping the gate wiring 35.

The wiring 61 is in contact with the gate wiring 35.

The wiring 62 overlaps the active layer 30 in one region where the active layer 30 is divided into two regions across a portion where the active layer 30 overlaps the gate wiring 35, the other region thereof overlapping the gate wiring 34.

The wiring 63 is in contact with the active layer 30 in a region between a portion where the active layer 30 overlaps the gate wiring 34 and a portion where the active layer 30 overlaps the gate wiring 35. Further, the wiring 63 overlaps the active layer 31 in one region where the active layer 31 is divided into two regions across a portion where the active layer 31 overlaps the gate wiring 34, the other region thereof overlapping the gate wiring 35.

The wiring 64 overlaps the active layer 31 in one region where the active layer 31 is divided into two regions across a portion where the active layer 31 overlaps the gate wiring 35, the other region thereof overlapping the gate wiring 34.

The wiring 65 is in contact with the gate wiring 34.

In this way, according to a design of FIG. 5, the wirings 60 to 65 are manufactured to thereby manufacture the NAND circuit as shown in FIG. 5.

Note that, in this embodiment, an example has been described in which the NAND circuit is composed of the basic cells of FIG. 1A and FIG. 2A, but the present invention is not limited to this circuit configuration. The configuration of basic cell is not limited to those shown in FIG. 1A and FIG. 2A, and it can be appropriately designed by a designer.

Further, the circuit or logic element formed based on the basic cells is not limited to the NAND circuit, and other circuits or logic elements can be manufactured. At this time, it is not required to use all the TFTs formed in the basic cells for designing a circuit or logic element, and thus only a part of the TFTs of the basic cells may be used for forming the circuit or logic element. For example, in this embodiment, the p-channel TFT 11 and the n-channel TFT 14 are not used. Further, the basic cells with the configuration shown in FIG. 1A and FIG. 2A and various basic cells with other configurations may be formed on the substrate in advance to thereby form the logic element or circuit using the basic cells with various configurations.

[Embodiment 2]

In this embodiment, a description is made of an example in which the terminals and the nodes of the basic cells shown in FIG. 1A and FIG. 2A are connected appropriately through the wirings formed in a layer different from a layer where the active layer and the gate are formed to thereby manufacture a NOR circuit.

Figure 6A:
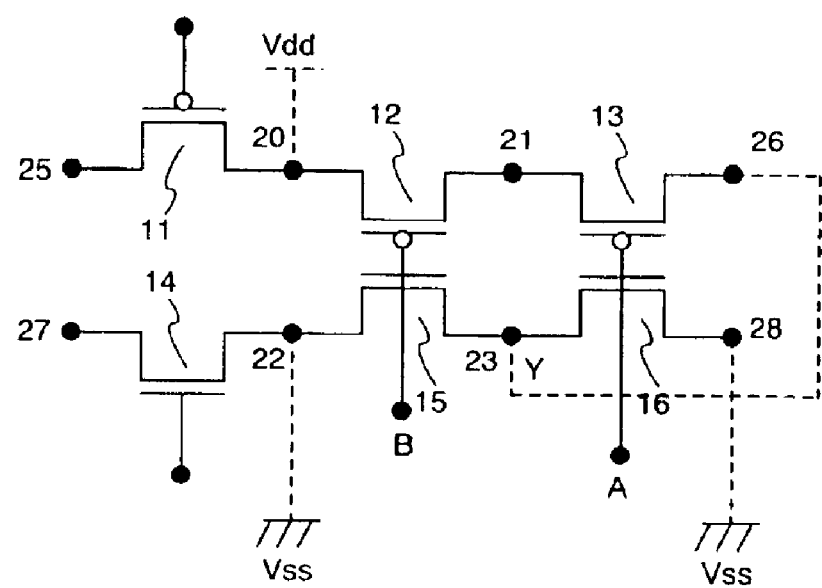
FIGS. 6A and 6B are views for showing a circuit diagram of NOR formed by using a basic cell shown in FIG. 1.

FIG. 6A is a circuit diagram showing a NOR circuit formed based on the basic cells of FIG. 1A. In FIG. 6A, the node 23 and the terminal 26 in the basic cells of FIG. 1A are connected to each other. Also, the voltage Vdd is applied to the node 20, whereas the voltage Vss is applied to the node 22 and the terminal 28. Here, Vdd>Vss.

Figure 6B:
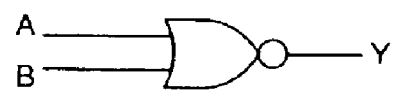

FIG. 6B is an equivalent circuit diagram of FIG. 6A.

Figure 7:
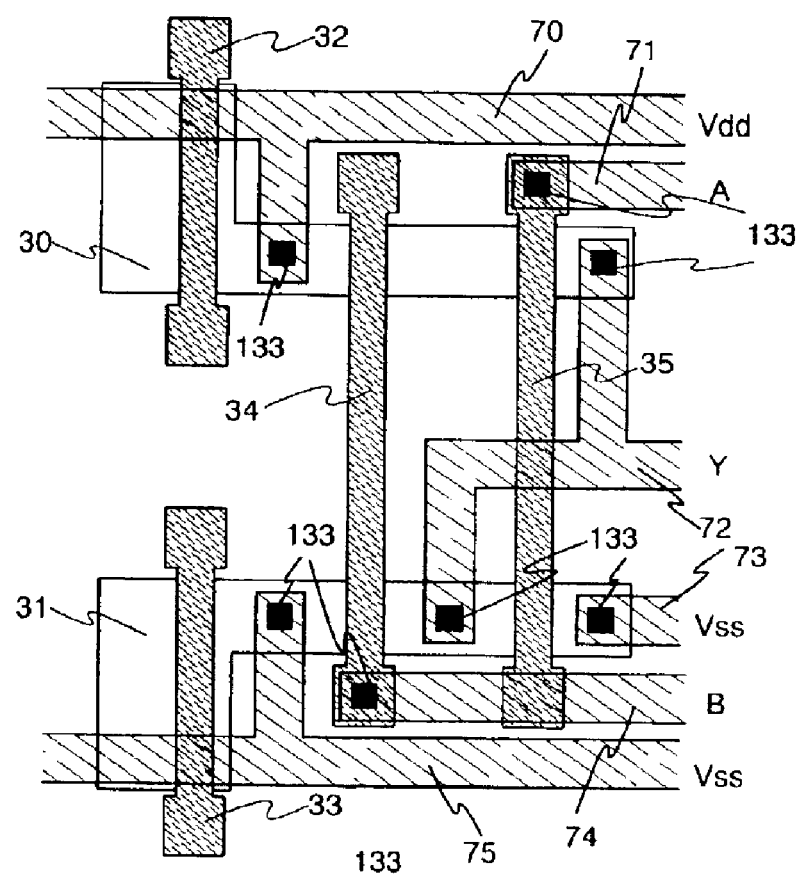
FIG. 7 is a view for showing a top surface view of NOR formed by using a basic cell shown in FIG. 1.

FIG. 7 is a top view of the NOR circuit of FIG. 6A. An interlayer insulating film (not shown) is formed so as to cover the active layers 30 and 31, the gate wirings 32 to 35, and the gate insulating film (not shown). Then, on the interlayer insulating film, wirings 70 to 75 are formed in contact with any of the active layers 30 and 31 and gate wirings 32 to 35 through contact holes formed in the interlayer insulating film and the gate insulating film.

In FIG. 7, reference numeral 133 denotes a contact portion.

Specifically, the wiring 70 overlaps the active layer 30 in one region where the active layer 30 is divided into two regions across a portion where the active layer 30 overlaps the gate wiring 34, the other region thereof overlapping the gate wiring 35.

The wiring 71 is in contact with the gate wiring 35.

The wiring 72 overlaps the active layer 30 in one region where the active layer 30 is divided into two regions across a portion where the active layer 30 overlaps the gate wiring 35, the other region thereof overlapping the gate wiring 34. Further, the wiring 72 is in contact with the active layer 31 in a region between a portion where the active layer 31 overlaps the gate wiring 34 and a portion where the active layer 31 overlaps the gate wiring 35.

The wiring 73 overlaps the active layer 31 in one region where the active layer 31 is divided into two regions across a portion where the active layer 31 overlaps the gate wiring 35, the other region thereof overlapping the gate wiring 34.

The wiring 74 is in contact with the gate wiring 34.

The wiring 75 overlaps the active layer 31 in one region where the active layer 31 is divided into two regions across a portion where the active layer 31 overlaps the gate wiring 34, the other region thereof overlapping the gate wiring 35.

In this way, according to a design of FIG. 7, the wirings 70 to 75 are manufactured to thereby manufacture the NOR circuit as shown in FIG. 7.

Note that, in this embodiment, an example has been described in which the NOR circuit is composed of the basic cells of FIG. 1A and FIG. 2A, but the present invention is not limited to this circuit configuration. The configuration of basic cell is not limited to those shown in FIG. 1A and FIG. 2A, and it can be appropriately designed by a designer. Further, the circuit or logic element formed based on the basic cells is not limited to the NOR circuit, and other circuits or logic elements can be manufactured. At this time, it is not required to use all the TFTs formed in the basic cells for designing a circuit or logic element, and thus only a part of the TFTs of the basic cells may be used for forming the circuit or logic element. For example, in this embodiment, the p-channel TFT 11 and the n-channel TFT 14 are not used. Further, the basic cells with the configuration shown in FIG. 1A and FIG. 2A and various basic cells with other configurations may be formed on the substrate in advance to thereby form the logic element or circuit using the basic cells with various configurations as well.

This embodiment can be implemented in combination with Embodiment 1.

[Embodiment 3]

In this embodiment, the structure of the semiconductor device manufactured by using the design method of the present invention is described taking the light emitting device for example.

Figure 8:
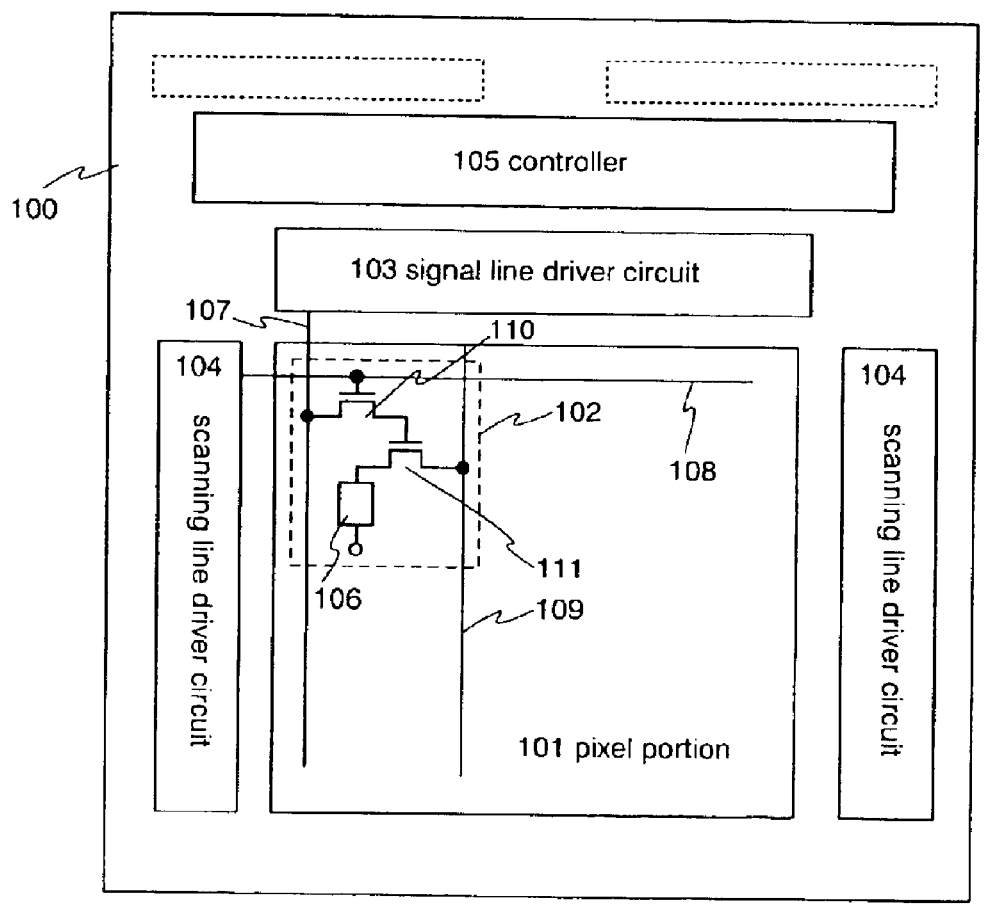
FIG. 8 is a view for showing a block diagram of a light emitting device of the present invention.

FIG. 8 is a block figure of the light emitting device of this embodiment. In the light emitting device shown in FIG. 8, the pixel portion 101 equipped with plural pixels 102, the signal line driver circuit 103, the scanning line driver circuit 104, and the controller 105 are provided on the substrate 100.

Though this embodiment shows one pixel 102, actually, the plural pixels 102 are formed. The pixel 102 comprise the OLED 106, the signal line 107, the scanning line 108, the power source line 109, and TFTs 110 and 111.

The controller 105 inputs the signal which determine the operation timing of the scanning line driver circuit 104 and the signal lien driver circuit 103 into each driver circuit.

For example, the clock signal (CLK) and the start pulse signal (SP) are inputted into the scan driver circuit 104. A select signal which determines pixel select timing is generated from inputted CLK and SP in the scanning line driver circuit. The pixel 102 is selected by the select timing that is inputted into the scanning line 108 from the scan driver circuit 104.

In the signal line driver circuit 103, the clock signal (CLK), the start pulse signal (SP), and the video signal are inputted. The sampling signal which determines the timing of a video signal sampling is generated in the signal line driver circuit 103. The signal driver circuit 103 samples the video signal synchronously with the sampling signal generated in the signal line driver circuit 103 and the sampled video signal is inputted to the signal line 107. The video signal is inputted to the selected pixel 102.

Figure 9A:
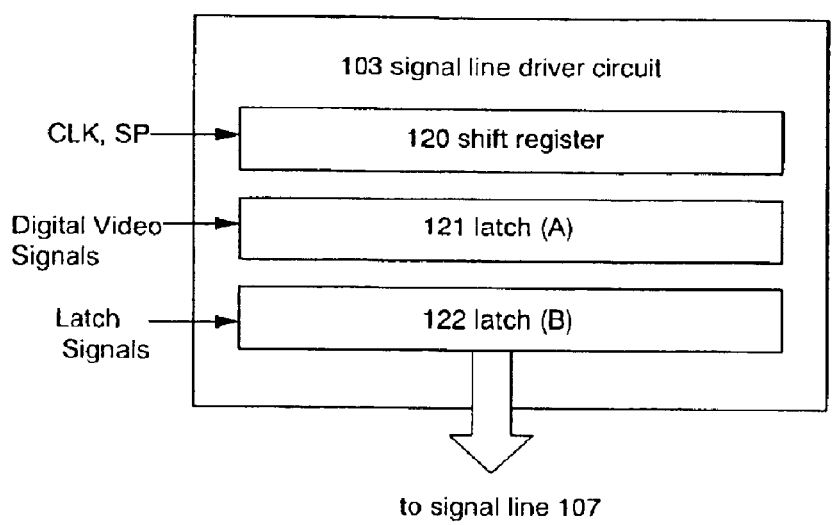
FIGS. 9A and 9B are views for showing a driver circuit block diagram of the light emitting device of the present invention.

The more detailed structure of the signal line driver circuit 104 and the scanning line driver 104 of this embodiment is described with reference to FIG. 9. in FIG. 9, the case that the video signal is a digital signal is described. FIG. 9A shows the signal line driver circuit 103 and it comprises a shift resistor 120, a latch (A) 121, and a latch (B) 122.

In the signal line driver circuit 103, the clock signal (CLK) and the start pulse signal (SP) are inputted into the shift resistor 120. The shift register 120 generates sampling signals in order based on the clock signal (CK) and the start pulse (SP), and the sampling signals are supplied in sequence to subsequent circuits after passing through the buffer (not shown in the figures).

Alternatively, the sampling signal from the shift register 120 may be buffered and amplified by a buffer or the like. Since many circuits or circuit elements are connected to the wiring into which the sampling signal is inputted, the wiring has a high load capacitance (parasitic capacitance). This buffer is effective to prevent the "delay" of the rise or fall of the timing signal caused by the high load capacitance. The buffer is not always necessary to provide.

The sampling signal amplified by a buffer is inputted to the latch (A) 121. The latch (A) 121 has a plurality of latch stages for processing n-bit digital video signal. The latch (A) 121 gradually writes in and maintains the n-bit digital video signals inputted from external of the signal line driver circuit 103, when the sampling signal is inputted.

When the digital video signal is inputted to the latch (A) 121, the digital video signal may be successively inputted to the plurality of latch stages of the latch (A) 121. However, the present invention is not limited to the structure. The plurality of latch stages of the latch (A) 121 may be divided into a certain number of groups, and the video signals may be inputted to the respective groups at the same time in parallel, performing partitioned driving. In addition, the number of the group is referred to as the divisional number. For example, when the latches are divided into groups every four stages, it is referred to as partitioned driving with 4 divisions.

The period during which the video signals is completely written into all of the latch stages of the latch (A) 121 is referred to as a line period. In practice, there are cases in which the line period includes the addition of a horizontal return period to the above line period.

One line period is completed, the latch signal is inputted to the latch (B) 122. At the moment, the video signals written into and stored in the latch (A) 121 are send all together to be written into and stored in all stages of the latch (B) 122.

In the latch (A) 121 after completing sending the digital video signal to the latch (B) 122, it is performed to write into the digital video signal in accordance with the timing signal from the shift resister 120.

In the second ordered one line period, the digital video signal that is written into and stored in the latch (B) 122 is inputted to the signal line.

In place of a shift register, it is also practicable to utilize a different circuit like a decoder circuit to serially write in digital video signals to latch circuit.

Figure 9B:
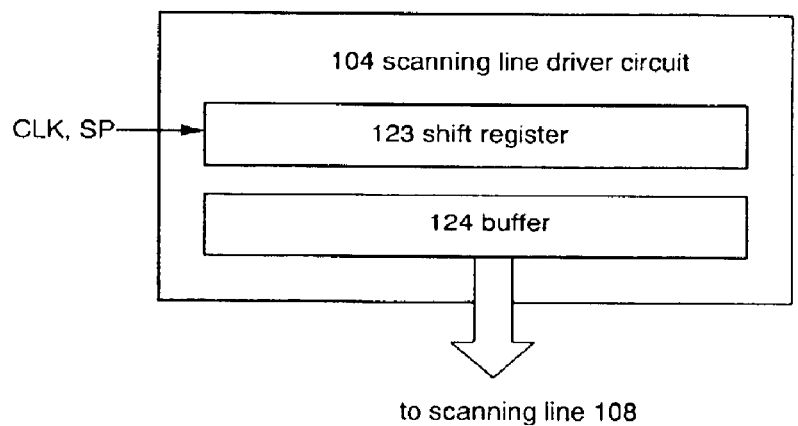

FIG. 9B exemplifies a block diagram of a scanning line driver circuit.

The scanning line driver circuit 104 comprises a shift register 123 and a buffer circuit 124. Depending on the circumstances, a level shifter may also be provided.

In the scanning line drive circuit 104, the select signal from the shift register 123 is input to the buffer circuit 124 and inputted to a corresponding scanning line. The scanning line is connected to the gate of the TFTs of one line pixel, and all the switching TFTs of one line pixel have to be turned ON simultaneously. Therefore, the use of a buffer with a large electric current capacity is required.

In place of a shift register, it is also practicable to utilize a different circuit like a decoder circuit to select gate signals and provide timing signals.

Figure 10:
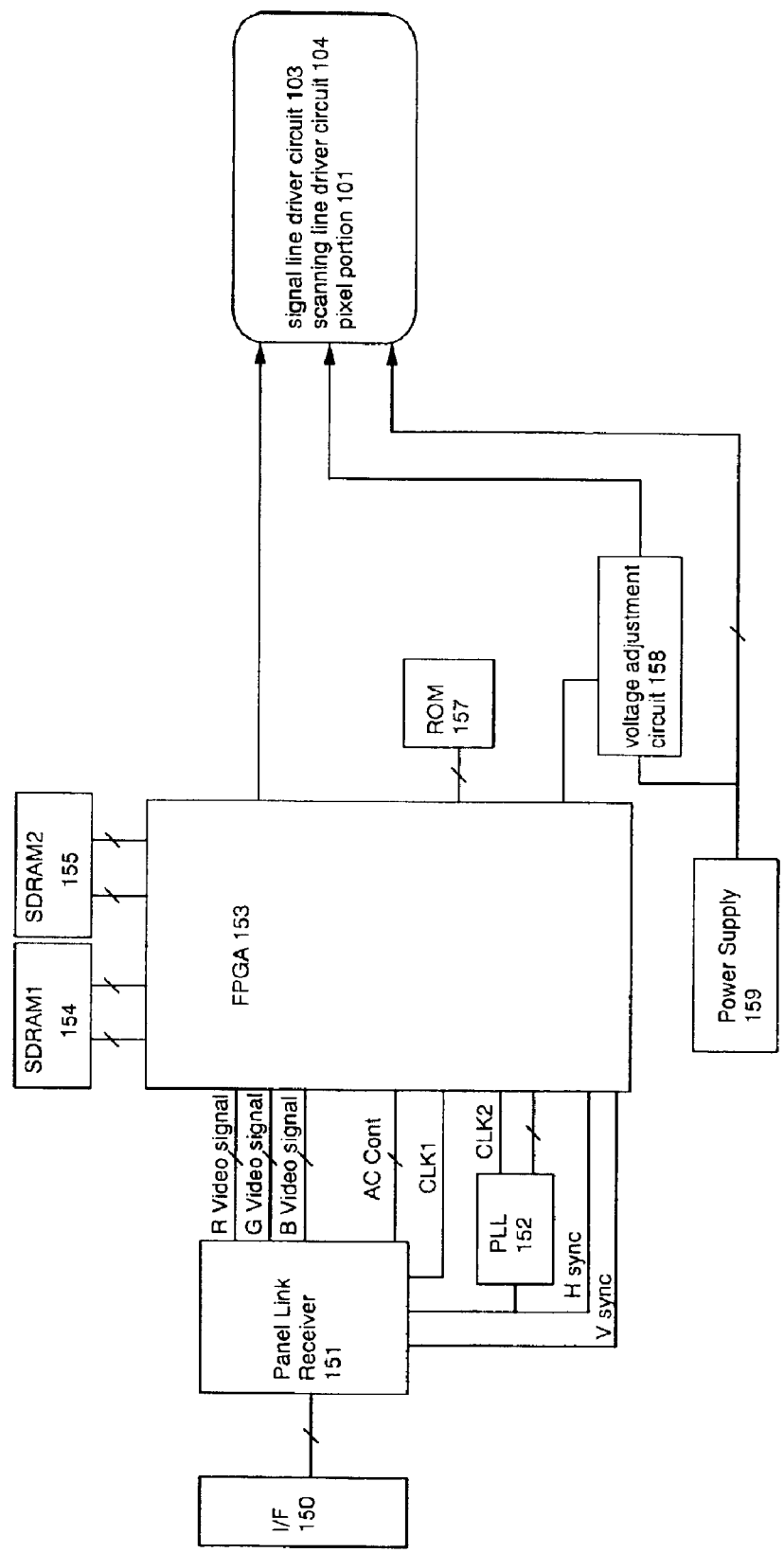
FIG. 10 is a view driver for showing a circuit block diagram of the light emitting device of the present invention.

Next, the detailed composition of a controller 105 is explained. The composition of the controller of this embodiment is shown in FIG. 10. A controller 105 is composed of an interface (I/F) 150, the panel link receiver 151, the phase locked loop 152 (PLL), the field programmable logic device 153 (FPGA), SDRAM (Synchronous Dynamic Random Access Memory) 154 and 155, ROM (Read Only Memory) 157, the voltage adjustment circuit 158, and the power supply 159. In addition, although SDRAM is used in this embodiment, if writing and read-out of high-speed data are possible instead of SDRAM, it is possible to also use DRAM (Dynamic Random Access Memory) and SRAM (Static Random Access Memory).

In the panel link receiver 151, of the digital video signal is carried out parallel-serial conversion and inputted into the semiconductor display device through the interface 150, and it is inputted into the field programmable logic device 153 as a digital video signal corresponding to each color of R, G, and B.

Moreover, based on the various signals inputted into the semiconductor display device through the interface 150, a Hsync signal, a Vsync signal, the clock signal CLK, and exchange voltage (AC Cont) are generated in the panel link receiver 151, and they are inputted into the field programmable logic device 153.

The phase locked loop 152 has the function to unite the phase of the frequency of the various signals inputted into a semiconductor display device, and the frequency of the field programmable logic device 153 of operation. Although the frequency of the field programmable logic device 153 of operation is not necessarily the same as the frequency of the various signals inputted into a semiconductor display device, the frequency of the field programmable logic device 153 of operation is adjusted in the phase locked loop 152 so that it may synchronize mutually.

The program which controls operation of the field programmable logic device 153 is memorized in ROM 157, and the field programmable logic device 153 operates according to this program.

The digital video signal inputted into the signal conversion part 153 is once written in SDRAMs 154 and 155, and is held. In the field programmable logic device 153, among the digital video signals of all the bits currently held at SDRAM 154, every 1 bit of digital video signals corresponding to all pixels is read, and they are inputted into a signal line driver circuit.

Moreover, in the field programmable logic device 153, the information about the length of the luminescence period of OLED corresponding to each bit is inputted into a scanning line driver circuit.

In addition, the voltage adjustment circuit 158 adjusts the voltage between the anode and the cathode of OLED of each pixel synchronizing with the signal inputted from the field programmable logic device 153. The power supply 159 supplies the voltage of fixed height to the voltage adjustment circuit 158, the signal line driver circuit 103, the scanning line driver circuit 104, and the pixel portion 101.

The design method of the present invention can be used to the circuit among various kinds of circuits held by controller if the circuit can be formed by using TFT.

The driver circuit and controller that are used in this invention are not limited to the composition shown in this embodiment. This embodiment may also be implemented by being freely combined with Embodiments 1 or 2.

[Embodiment 4]

In this embodiment, a description is made of an example in which the basic cells shown in FIG. 2A are used, and the terminals and the nodes of the basic cells are connected appropriately through the wirings formed in a layer where the active layer and the substrate are formed to thereby attain D flip flop.

Figure 11A:
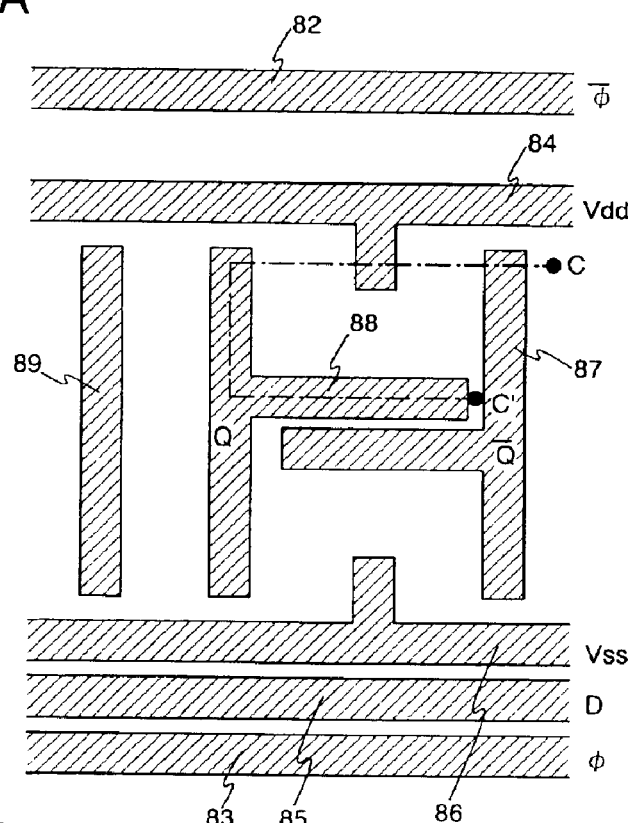
FIGS. 11A and 11B are views for showing a top surface view of D flip flop formed by using a basic cell shown in FIG. 1.
Figure 21A:
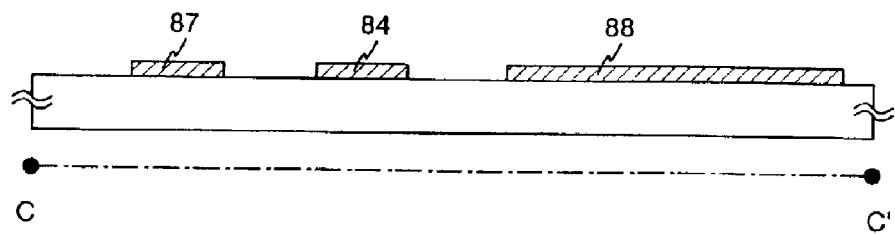
FIGS. 21A and 21B are views for showing cross-sectional views of a TFT for using a controller of the present invention.

The layout of wirings 82 to 89 formed on the substrate before that the basic cells are formed is illustrated in FIG. 11A. FIG. 21A shows an cross-sectional view taken along the line of C–C' of FIG. 11A. After the wirings 82 to 89 are formed, the base film 95 as an insulating film is formed. CMP (Chemical Mechanical Polishing) may be used in order to planarize the surface of the base film by removing the irregularities due to the wirings 82 to 89.

After the base film is formed, a portion of either wirings 82 to 89 is exposed by removing a portion of the base film by an etching method.

By the design method of the present invention, the logic circuit or the circuit formed based on the layout of the wirings 82 to 89 and the position of the wirings 82 to 89 that are exposed by the base film etching are determined. Therefore, the layout of the wirings 82 to 89 and the position of the exposed wirings 82 to 89 by the base film etching are determined after the design of the controller is completed.

The active layers 30 and 31 are formed. The active layers 30 and 31 are in contact with an exposed portion due to the etching of the wirings 82 to 89. The gate insulating film 90 is formed to be in contact with the active layer 30 and 31. The portion of the gate insulating film and the base film are etched in order to expose the portion of either of wirings 82 to 89. Either of the gate wirings 32 to 35 is in contact with the exposed portion due to the etching of wirings 82 to 89.

Figure 11B:
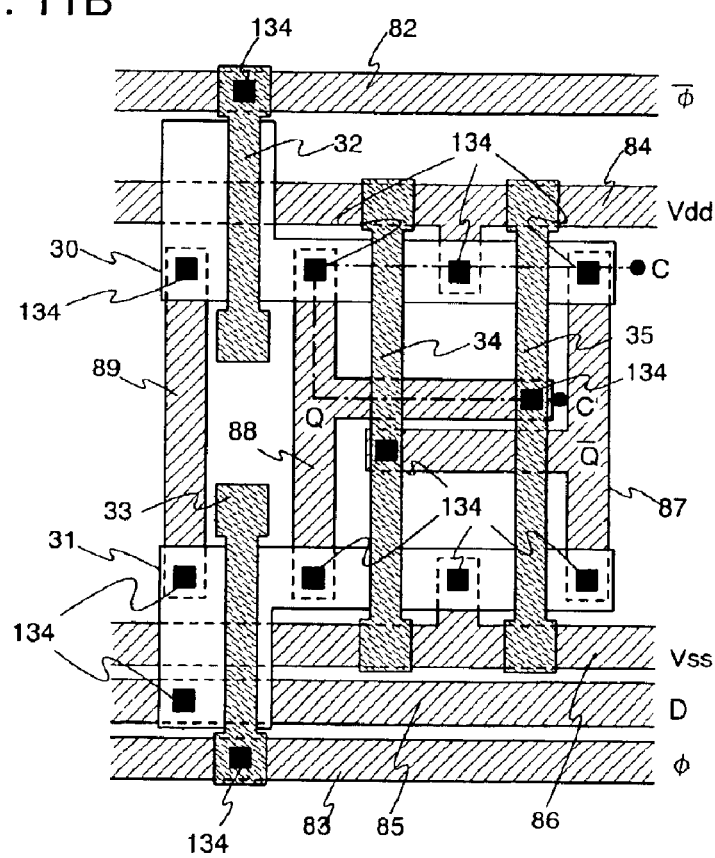
Figure 21B:
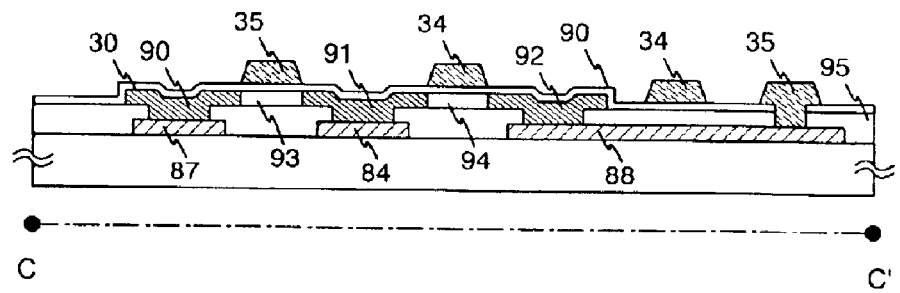

FIG. 21B is a cross-sectional view taken along the line C–C' of FIG. 11B.

In FIG. 11B, reference numeral 134 denotes a contact portion.

Specifically, the wiring 82 is in contact with the gate wiring 32. The wiring 83 is in contact with the gate wiring 33.

The wiring 84 is in contact with the active layer 30 in a region 91 between a portion 94 where the active layer 30 overlaps the gate wiring 34 and a portion 93 where the active layer 30 overlaps the gate wiring 35. The wiring 86 is in contact with the active layer 31 in a region between a portion where the active layer 31 overlaps the gate wiring 34 and a portion where the active layer 31 overlaps the gate wiring 35.

The wiring 89 overlaps the active layer 30 in one region where the active layer 30 is divided into two regions across a portion where the active layer 30 overlaps the gate wiring 32, the other region thereof overlapping another gate wiring. The wiring 89 overlaps the active layer 31 in one region where the active layer 31 is divided into two regions across a portion where the active layer 31 overlaps the gate wiring 33, the other region thereof overlapping another gate wiring.

The wiring 87 overlaps the active layer 30 in one region where the active layer 30 is divided into two regions across a portion where the active layer 30 overlaps the gate wiring 35, the other region thereof 90 overlapping another gate wiring. The wiring 87 overlaps the active layer 31 in one region where the active layer 31 is divided into two regions across a portion where the active layer 31 overlaps the gate wiring 35, the other region thereof overlapping another gate wiring. Further, the wiring 87 is in contact with the gate wiring 34.

The wiring 88 is in contact with the gate wiring 35. The wiring 88 is in contact with the active layer 30 in a region 92 between a portion where the active layer 30 overlaps the gate wiring 32 and a portion 94 where the active layer 30 overlaps the gate wiring 34. The wiring 88 is in contact with the active layer 31 in a region between a portion where the active layer 31 overlaps the gate wiring 33 and a portion where the active layer 31 overlaps the gate wiring 34.

The wiring 85 overlaps the active layer 31 in one region where the active layer 31 is divided into two regions across a portion where the active layer 31 overlaps the gate wiring 33, the other region thereof overlapping another gate wiring.

D-flip-flop-circuit as shown in FIG. 11B can be manufactured by forming the wirings 82 to 89 after design shown in FIG. 11B.

Figure 12:
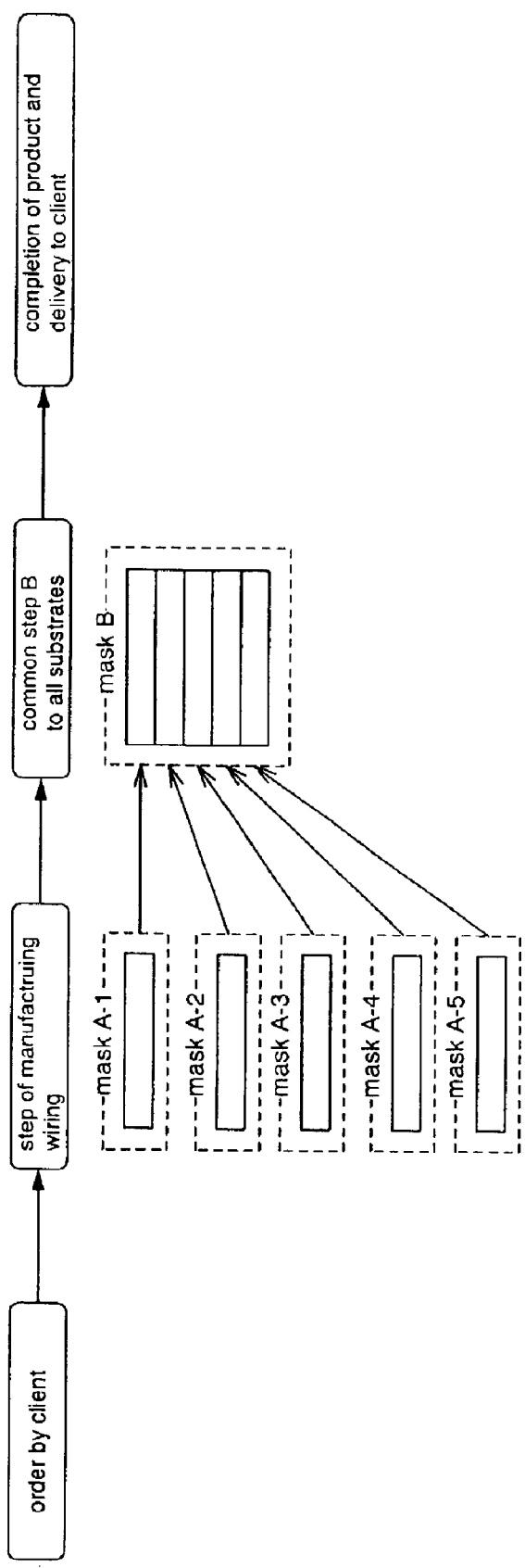
FIG. 12 is a view for showing flow chart of an order receiving system of the present invention.

Next, a description will be made of an order receiving system for the semiconductor display device of the present invention by use of the above-mentioned designing method with reference to a flow chart of FIG. 12.

In this embodiment, the wirings are formed in accordance with the design of the controller when a specification of the controller is determined based on an order from a client. The wirings are manufactured using masks (A-1, A-2, A-3, A-4, and A-5) different from each other, which are formed in accordance with the design of the controller of each substrate.

First, step B is performed on all substrates using a mask B in common. Next, step B common to all substrates includes the step up through forming an interlayer insulating film overlapping the TFT. Typically, formation of an active layer, crystallization of an active layer, formation of a gate insulating film, addition of impurity elements to an active layer, formation of a gate, and formation of an insulating film can be included. In a case of a liquid crystal display device, for example, step B includes formation of an interlayer insulating film, formation of a pixel electrode, bonding to an opposing substrate, injection of liquid crystal, and other steps. In a case of a light emitting device using an OLED (organic light emitting device), step B includes formation of an interlayer insulating film, formation of a pixel electrode, formation of an organic light emitting layer, formation of a cathode, formation of a protective film, sealing of a substrate, and other steps.

When step B common to all substrates is ended, the semiconductor display device is completed as a product to be delivered to the client.

With the above-mentioned structure, when the specification of the controller is changed, it is enough to change only the design of wirings connecting the TFTs or logic elements formed in advance and the design of the contact hole. Therefore, only the change of two masks for patterning and contact hole suffices. Accordingly, it is possible to reduce the cost associated with the design change of the controller and also to manufacture the controller of the various specifications.

The driver circuit used in the present invention is not limited to the structure shown in this embodiment. This embodiment can be implemented by freely combined with Embodiments 1 to 3.

[Embodiment 5]

In this embodiment, a simultaneous manufacturing method of TFT (n-channel TFT and p-channel TFT) of the pixel portion and the controller on the same substrate are described.

First, as shown in FIG. 13A, a base film 5002 formed of an insulating film such as a silicon oxide film, a silicon nitride film or a silicon oxynitride film is formed on a substrate 5001 formed of glass such as barium borosilicate glass or alumino borosilicate glass represented by #7059 glass and #1737 glass of Coning Corporation. For example, a silicon oxynitride film 5002a formed from $SiH_4$, $NH_3$ and $N_2O$ by the plasma CVD method and having a thickness of from 10 to 200 nm (preferably 50 to 100 nm) is formed. Similarly, a hydrogenerated silicon oxynitride film 5002b formed from $SiH_4$ and $N_2O$ and having a thickness of from 50 to 200 nm (preferably 100 to 150 nm) is layered thereon. In this embodiment, the base film 5002 has a two-layer structure, but may also be formed as a single layer film of one of the above insulating films, or a laminate film having more than two layers of the above insulating films.

Island-like semiconductor layers 5003 to 5006 are formed from a crystalline semiconductor film obtained by conducting laser crystallization method or a known thermal crystallization method on a semiconductor film having an amorphous structure. These island-like semiconductor layers 5003 to 5006 each has a thickness of from 25 to 80 nm (preferably 30 to 60 nm). No limitation is put on the material of the crystalline semiconductor film, but the crystalline semiconductor film is preferably formed from silicon, a silicon germanium (SiGe) alloy, etc.

When the crystalline semiconductor film is to be manufactured by the laser crystallization method, an excimer laser, a YAG laser and an $YVO_4$ laser of a pulse oscillation type or continuous light emitting type are used. When these lasers are used, it is preferable to use a method in which a laser beam radiated from a laser oscillator is converged into a linear shape by an optical system and then is irradiated to the semiconductor film. A crystallization condition is suitably selected by an operator. When the excimer laser is used, pulse oscillation frequency is set to 300 Hz, and laser energy density is set to from 100 to 400 $mJ/cm^2$ (typically 200 to 300 $mJ/cm^2$). When the YAG laser is used, pulse oscillation frequency is preferably set to from 30 to 300 kHz by using its second harmonic, and laser energy density is preferably set to from 300 to 600 $mJ/cm^2$ (typically 350 to 500 $mJ/cm^2$). The laser beam converged into a linear shape and having a width of from 100 to 1000 $\mu$m, e.g. 400 $\mu$m, is irradiated to the entire substrate surface. At this time, overlapping ratio of the linear laser beam is set to from 50 to 90%.

Note that, a gas laser or solid state laser of continuous oscillation type or pulse oscillation type can be used. The gas laser such as an excimer laser, Ar laser, Kr laser and the solid state laser such as YAG laser, $YVO_4$ laser, YLF laser, $YAlO_3$ laser, glass laser, ruby laser, alexandrite laser, Ti: sapphire laser can be used as the laser beam. Also, crystals such as YAG laser, $YVO_4$ laser, YLF laser, $YAlO_3$ laser wherein Cr, Nd, Er, Ho, Ce, Co, Ti or Tm is doped can be used as the solid state laser. A basic wave of the lasers is different depending on the materials of doping, therefore a laser beam having a basic wave of approximately 1$\mu$m is obtained. A harmonic corresponding to the basic wave can be obtained by the using non-linear optical elements.

The ultraviolet laser light generated by another non-linear element can also be used after that the infrared laser light generated from the solid laser is converted by using the non-linear optical element into the green laser light.

When a crystallization of an amorphous semiconductor film is conducted, it is preferable that the second harmonic through the fourth harmonic of basic waves is applied by using the solid state laser which is capable of continuous oscillation in order to obtain a crystal in large grain size. Typically, it is preferable that the second harmonic (with a thickness of 532 nm) or the third harmonic (with a thickness of 355 nm) of an $Nd:YVO_4$ laser (basic wave of 1064 nm) is applied. Specifically, laser beams emitted from the continuous oscillation type $YVO_4$ laser with 10 W output is converted into a harmonic by using the non-linear optical elements. Also, a method of emitting a harmonic by applying crystal of $YVO_4$ and the non-linear optical elements into a resonator. Then, more preferably, the laser beams are formed so as to have a rectangular shape or an elliptical shape by an optical system, thereby irradiating a substance to be treated. At this time, the energy density of approximately 0.01 to 100 $MW/cm^2$ (preferably 0.01 to 10 $MW/cm^2$) is required. The semiconductor film is moved at approximately 10 to 2000 cm/s rate relatively corresponding to the laser beams so as to irradiate the semiconductor film.

Next, a gate insulating film 5007 covering the island-like semiconductor layers 5003 to 5006 is formed. The gate insulating film 5007 is formed from an insulating film containing silicon and having a thickness of from 40 to 150 nm by using the plasma CVD method or a sputtering method. In this embodiment, the gate insulating film 5007 is formed from a silicon oxynitride film with a thickness of 120 nm. However, the gate insulating film is not limited to such a silicon oxynitride film, but it may be an insulating film containing other silicon and having a single layer or a laminated layer structure. For example, when a silicon oxide film is used, TEOS (Tetraethyl Orthosilicate) and $O_2$ are mixed by the plasma CVD method, the reaction pressure is set to 40 Pa, the substrate temperature is set to from 300 to 400° C., and the high frequency (13.56 MHz) power density is set to from 0.5 to 0.8 $W/cm^2$ for electric discharge. Thus, the silicon oxide film can be formed by discharge. The silicon oxide film manufactured in this way can then obtain preferable characteristics as the gate insulating film by thermal annealing at from 400 to 500° C.

A first conductive film 5008 and a second conductive film 5009 for forming a gate electrode are formed on the gate insulating film 5007. In this embodiment, the first conductive film 5008 having a thickness of from 50 to 100 nm is formed from Ta, and the second conductive film 5009 having a thickness of from 100 to 300 nm is formed from W.

The Ta film is formed by a sputtering method, and the target of Ta is sputtered by Ar. In this case, when suitable amounts of Xe and Kr are added to Ar, internal stress of the Ta film is released, and pealing off this film can be prevented. Resistivity of the Ta film of a phase is about 20 $\mu\Omega$cm, and this Ta film can be used for the gate electrode. However, resistivity of the Ta film of β phase is about 180 $\mu\Omega$cm, and is not suitable for the gate electrode. When tantalum nitride having a crystal structure close to that of the α phase of Ta and having a thickness of about 10 to 50 nm is formed in advance as the base for the Ta film to form the Ta film of the α phase, the Ta film of α phase can be easily obtained.

The W film is formed by the sputtering method with W as a target. Further, the W film can be also formed by a thermal CVD method using tungsten hexafluoride ($WF_6$). In any case, it is necessary to reduce resistance to use this film as the gate electrode. It is desirable to set resistivity of the W film to be equal to or smaller than 20 $\mu\Omega$cm. When crystal grains of the W film are increased in size, resistivity of the W film can be reduced. However, when there are many impurity elements such as oxygen, etc. within the W film, crystallization is prevented and resistivity is increased. Accordingly, in the case of the sputtering method, a W-target of 99.9999% or 99.99% in purity is used, and the W film is formed by taking a sufficient care of not mixing impurities from a gaseous phase into the W film time when the film is to be formed. Thus, a resistivity of from 9 to 20 $\mu\Omega$cm can be realized.

In this embodiment, the first conductive film 5008 is formed from Ta, and the second conductive film 5009 is formed from W. However, the present invention is not limited to this case. Each of these conductive films may also be formed from an element selected from Ta, W, Ti, Mo, Al and Cu, or an alloy material or a compound material having these elements as principal components. Further, a semiconductor film represented by a polysilicon film doped with an impurity element such as phosphorus may also be used. Examples of combinations other than those shown in this embodiment include: a combination in which the first conductive film is formed from tantalum nitride (TaN), and the second conductive film is formed from W; a combination in which the first conductive film is formed from tantalum nitride (TaN), and the second conductive film is formed from Al; and a combination in which the first conductive film is formed from tantalum nitride (TaN), and the second conductive film is formed from Cu. As the first conductive film or the second conductive film, a semiconductor film represented by a polysilicon film doped with an impurity element such as phosphorus or an Ag Pd Cu alloy may also be used.

Furthermore, the conductive film is not limited to the two layer structure. For example, a three layer structure in which a tungsten film, an alloy film of aluminum and silicon (Al—Si), and a titanium nitride film are laminated in order may also be used. In addition, tungsten nitride may also be used as a substitute for tungsten, and an aluminum and titanium (Al—Ti) alloy film may also be used as a substitute for the aluminum and silicon (Al—Si) alloy film, and a titanium film may also be used as a substitute for the titanium nitride film if a three layer structure is employed.

Note that it is very important to select an optimal etching method, and etchant type, in accordance with the conductive film materials.

Next, a mask 5010 is formed from a resist, and first etching processing for forming an electrode and wiring is performed. In this embodiment, an ICP (Inductively Coupled Plasma) etching method is used, and $CF_4$ and $Cl_2$ are mixed with a gas for etching. RF (13.56 MHz) power of 500 W is applied to the electrode of coil type at a pressure of 1 Pa so that plasma is generated. RF (13.56 MHz) of 100 W power is also applied to a substrate side (sample stage), and a substantially negative self bias voltage is applied. When $CF_4$ and $Cl_2$ are mixed, the W film and the Ta film are etched to the same extent.

Under the above etching condition, end portions of a first conductive layer and a second conductive layer are formed into a tapered shape by effects of the bias voltage applied to the substrate side by making the shape of the mask formed from the resist into an appropriate shape. The angle of a taper portion is set to from 15° to 45°. It is preferable to increase an etching time by a ratio of about 10 to 20% so as to perform the etching without leaving the residue on the gate insulating film. Since a selection ratio of a silicon oxynitride film to the W film ranges from 2 to 4 (typically 3), an exposed face of the silicon oxynitride film is etched by about 20 to 50 nm by over-etching processing. Thus, conductive layers 5011 to 5016 of a first shape (first conductive layers 5011a to 5016a and second conductive layers 5011b to 5016b) formed of the first and second conductive layers are formed by the first etching processing. A region that is not covered with the conductive layers 5011 to 5016 of the first shape is etched by about 20 to 50 nm in the gate insulating film 5007, so that a thinned region is formed (FIG. 13B).

Then, an impurity element for giving an n-type conductivity is added by performing first doping processing (FIG. 13B). A doping method may be either an ion doping method or an ion implantation method. The ion doping method is carried out under the condition that a dose is set to from $1 \times 10^{13}$ to $5 \times 10^{14}$ atoms/cm$^2$, and an acceleration voltage is set to from 60 to 100 keV. An element belonging to group 15, typically, phosphorus (P) or arsenic (As) is used as the impurity element for giving the n-type conductivity. However, phosphorus (P) is used here. In this case, the conductive layers 5011 to 5014 serve as masks with respect to the impurity element for giving the n-type conductivity, and first impurity regions 5017 to 5024 are formed in a self-aligning manner. The impurity element for giving the n-type conductivity is added to the first impurity regions 5017 to 5024 in a concentration range from $1 \times 10^{20}$ to $1 \times 10^{21}$ atoms/cm$^3$.

Second etching processing is next performed without removing the resist mask as shown in FIG. 13C. A W film is etched selectively by using $CF_4Cl_2$ and $O_2$ as the etching gas. The conductive layers 5026 to 5031 of a second shape (first conductive layers 5026a to 5031a and second conductive layers 5026b to 5031b) are formed by the second etching processing. A region of the gate insulating film 5007, which is not covered with the conductive layers 5026 to 5031 of the second shape, is further etched by about 20 to 50 nm so that a thinned region is formed.

An etching reaction in the etching of the W film or the Ta film using the mixed gas of $CF_4$ and $Cl_2$ can be assumed from the vapor pressure of a radical or ion species generated and a reaction product. When the vapor pressures of a fluoride and a chloride of W and Ta are compared, the vapor pressure of $WF_6$ as a fluoride of W is extremely high, and vapor pressures of other $WCl_5$, $TaF_5$ and $TaCl_5$ are approximately equal to each other. Accordingly, both the W film and the Ta film are etched using the mixed gas of $CF_4$ and $Cl_2$. However, when a suitable amount of $O_2$ is added to this mixed gas, $CF_4$ and $O_2$ react and become CO and F so that a large amount of F-radicals or F-ions is generated. As a result, the etching speed of the W film whose fluoride has a high vapor pressure is increased. In contrast to this, the increase in etching speed is relatively small for the Ta film when F is increased. Since Ta is easily oxidized in comparison with W, the surface of the Ta film is oxidized by adding $O_2$. Since no oxide of Ta reacts with fluorine or chloride, the etching speed of the Ta film is further reduced. Accordingly, it is possible to make a difference in etching speed between the W film and the Ta film so that the etching speed of the W film can be set to be higher than that of the Ta film.

Figure 14A:
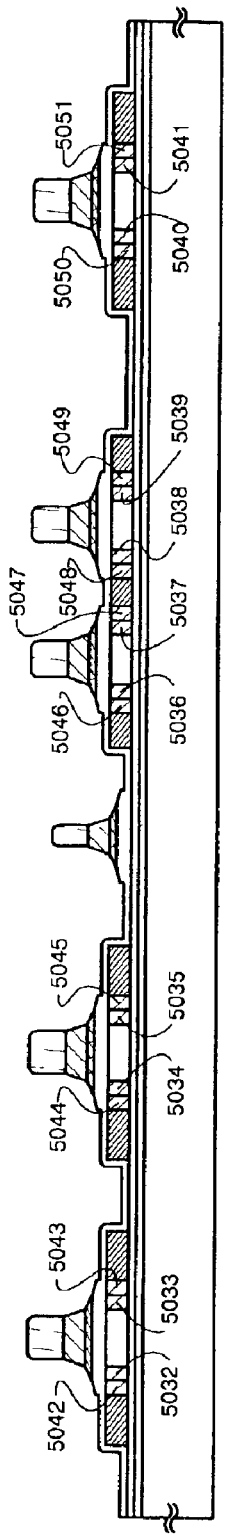
FIGS. 14A to 14C are views for illustrating a manufacturing method of a light emitting device of the present invention.

As shown in FIG. 14A, second doping processing is then performed. In this case, an impurity element for giving the n-type conductivity is doped in a smaller dose than in the first doping processing and at a high acceleration voltage by reducing a dose lower than that in the first doping processing. For example, the acceleration voltage is set to from 70 to 120 keV, and the dose is set to $1 \times 10^{13}$ atoms/cm$^2$. Thus, a new impurity region is formed inside the first impurity region formed in the island-like semiconductor layer in FIG. 13B. In the doping, the conductive layers 5026 to 5030 of the second shape are used as masks with respect to the impurity element, and the doping is performed such that the impurity element is also added to regions underside the second conductive layers 5026a to 5030a. Thus, the third impurity regions 5032 to 5041 overlapping with the second conductive layers 5026a to 5030a, and the second impurity regions 5042 to 5051 between the first impurity region and the third impurity region are formed. The concentration of the impurity elements giving an n-type is set to $1 \times 10^{17}$ atoms/cm$^3$ to $1 \times 10^{19}$ atoms/cm$^3$ in the second impurity region and $1 \times 10^{16}$ atoms/cm$^3$ to $1 \times 10^{18}$ atoms/cm$^3$ in the third impurity region.

Figure 14B:
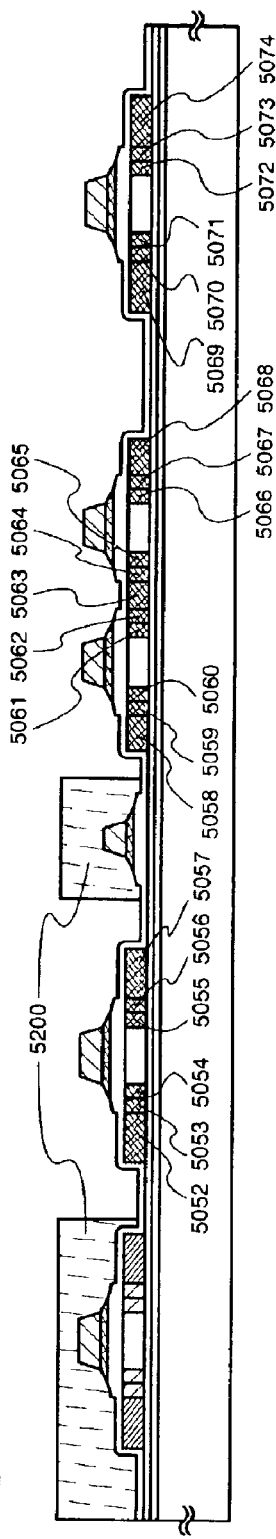

As shown in FIG. 14B, fourth impurity regions 5052 to 5074 having the opposite conductivity type to the first conductivity type are formed in the island-like semiconductor layers 5004 and 5006 for forming p-channel type TFTs. The second shape conductive layers 5027b and 5030b are used as masks against the impurity element and impurity regions are formed in a self-aligning manner. At this point, the island-like semiconductor layer 5003 for forming n-channel type TFTs and the wiring portion 5031 are entirely covered with a resist mask 5200. The impurity regions 5052 to 5074 have already been doped with phosphorus in different concentrations. The impurity regions 5052 to 5074 are doped with diborane ($B_2H_6$) through ion doping and its impurity concentrations are set to form $2\times10^{20}$ to $2\times10^{21}$ atoms/cm$^3$ in the respective impurity regions.

Through the steps above, the impurity regions are formed in the respective island-like semiconductor layers. The second shape conductive layers 5026 to 5030 overlapping the island-like semiconductor layers function as gate electrodes. Reference numeral 5031 functions as island-like first scanning line.

Figure 14C:
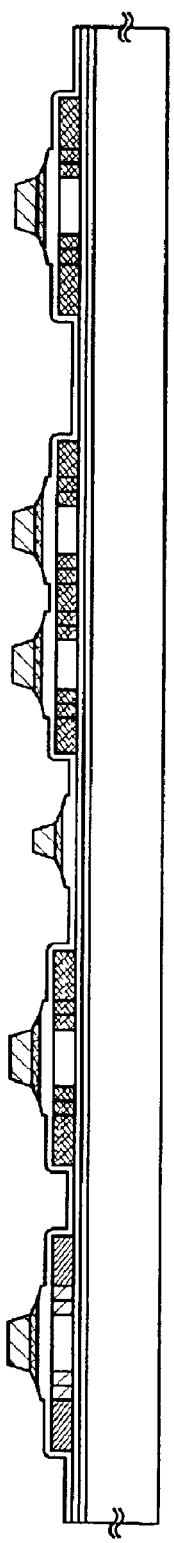

As shown in FIG. 14C, a step of activating the impurity elements added to the island-like semiconductor layers is performed to control the conductivity type. This process is performed by a thermal annealing method using a furnace for furnace annealing. Further, a laser annealing method or a rapid thermal annealing method (RTA method) can be applied. In the thermal annealing method, this process is performed at a temperature of from 400 to 700° C., typically from 500 to 600° C. within a nitrogen atmosphere in which oxygen concentration is equal to or smaller than 1 ppm and is preferably equal to or smaller than 0.1 ppm. In this embodiment, heat treatment is performed for four hours at a temperature of 500° C. When a wiring material used in the second conductive layers 5026 to 5031 is weak against heat, it is preferable to perform activation after an interlayer insulating film (having silicon as a principal component) is formed in order to protect wiring, etc.

When the laser annealing method is employed, the laser used in the crystallization can be used. When activation is performed, the moving speed is set as well as the crystallization processing, and the energy density of about 0.01 to 100 MW/cm$^2$ (preferably 0.01 to 10 MW/cm$^2$) is required.

Further, the heat treatment is performed for 1 to 12 hours at a temperature of from 300 to 450° C. within an atmosphere including 3 to 100% of hydrogen so that the island-like semiconductor layer is hydrogenerated. This step is to terminate a dangling bond of the semiconductor layer by hydrogen thermally excited. Plasma hydrogenation (using hydrogen excited by plasma) may also be performed as another measure for hydrogenation.

Next, as shown in FIG. 15A, a first interlayer insulating film 5075 is formed from a silicon oxynitride film with a thickness of 100 to 200 nm. The second interlayer insulating film 5076 from an organic insulating material is formed on the first interlayer insulating film. A film having an organic resin as a material is used as the second interlayer insulating film 5076. Polyimide, polyamide, acrylic, BCB (benzocyclobutene), etc. can be used as this organic resin. In particular, since the second interlayer insulating film 5076 is provided mainly for planarization, acrylic excellent in leveling the film is preferable. In this embodiment, an acrylic film having a thickness that can sufficiently level a level difference caused by the TFT is formed. The film thickness thereof is preferably set to from 1 to 5 µm (is further preferably set to from 2 to 4 µm).

In this embodiment, although the specification of the controller has not been determined yet, it is possible to previously complete the above-mentioned steps. The above-mentioned step is performed on all substrates using a mask in common. When the specification of the controller is determined, according to the specification of the controller, the position of the impurity regions (source/drain) of TFT in the controller, the layout of the wiring being contact with the gate, and the contact hole are determined on all substrate.

The contact hole to the first interlayer insulating film 5075, the second interlayer insulating film 5076, and the gate insulating film 5007 is formed. The wirings 5077 to 5079 of the controller and the wirings 5080 to 5083 connected to other TFT and wirings are formed simultaneously.

In the formation of the contact holes, contact holes reaching n-type impurity regions 5017 and 5018 or p-type impurity regions 5052 to 5074, a contact hole reaching wiring 5031 (not illustrated), a contact hole reaching an electric current supply line (not illustrated), and contact holes reaching gate electrodes (not illustrated) are formed by using a dry etching or wet etching method.

Further, a laminate film of a three-layer structure is patterned in a desired shape and is used as wirings 5077 to 5083. In this three-layer structure, a Ti film with a thickness of 100 nm, an aluminum film containing Ti with a thickness of 300 nm, and a Ti film with a thickness of 150 nm are continuously formed by the sputtering method. Of course, another conductive film may also be used.

Steps after the wiring formation is performed on all substrates using a mask in common.

The pixel electrode 5084 that is in contact with the connecting electrode 5082 is patterned to be formed. In this embodiment, an ITO film of 110 nm in thickness is formed as a pixel electrode 5084, and is patterned. Contact is made by arranging the pixel electrode 5084 such that this pixel electrode 5084 comes in contact with the connecting electrode 5082 and is overlapped with this connecting wiring 5082. Further, a transparent conductive film provided by mixing 2 to 20% of zinc oxide (ZnO) with indium oxide may also be used. This pixel electrode 5084 becomes an anode of the OLED (FIG. 15A).

As shown in FIG. 15B, an insulating film (a silicon oxide film in this embodiment) containing silicon and having a thickness of 500 nm is next formed. A third interlayer insulating film 5085 functions as a bank is formed in which an opening is formed in a position corresponding to the pixel electrode 5084. When the opening is formed, a side wall of the opening can easily be tapered by using the wet etching method. When the side wall of the opening is not gentle enough, deterioration of an organic light emitting layer caused by a level difference becomes a notable problem.

Next, an organic light emitting layer 5086 and a cathode (MgAg electrode) 5087 are continuously formed by using the vacuum evaporation method without exposing to the atmosphere. The organic light emitting layer 5086 has a thickness of from 80 to 200 nm (typically from 100 to 120 nm), and the cathode 5067 has a thickness of from 180 to 300 nm (typically from 200 to 250 nm).

In this process, the organic light emitting layer is sequentially formed with respect to a pixel corresponding to red, a pixel corresponding to green and a pixel corresponding to blue. In this case, since the organic light emitting layer has an insufficient resistance against a solution, the organic light emitting layer must be formed separately for each color instead of using a photolithography technique. Therefore, it is preferable to cover a portion except for desired pixels using a metal mask so that the organic light emitting layer is formed selectively only in a required portion.

Namely, a mask for covering all portions except for the pixel corresponding to red is first set, and the organic light emitting layer for emitting red light are selectively formed by using this mask. Next, a mask for covering all portions except for the pixel corresponding to green is set, and the organic light emitting layer for emitting green light are selectively formed by using this mask. Next, a mask for covering all portions except for the pixel corresponding to blue is similarly set, and the organic light emitting layer for emitting blue light are selectively formed by using this mask. Here, different masks are used, but instead the same single mask may be used repeatedly.

Here, a system for forming three kinds of light emitting element corresponding to RGB is used. However, a system in which an light emitting element for emitting white light and a color filter are combined, a system in which the light emitting element for emitting blue or blue green light is combined with a fluorescent substance (a fluorescent color converting medium: CCM), a system for overlapping the light emitting elements respectively corresponding to R, G, and B with the cathodes (opposite electrodes) by utilizing a transparent electrode, etc. may be used.

A known material can be used as the organic light emitting layer 5086. An organic material is preferably used as the known material in consideration of a driving voltage. For example, a four-layer structure consisting of a hole injection layer, a hole transportation layer, a light emitting layer and an electron injection layer is preferably used for the organic light emitting layer. This embodiment uses MgAg for the cathode of OLED but other known materials may also be used.

Next, the cathode 5087 is formed. This embodiment uses MgAg for the cathode 5087 but it is not limited thereto. Other known materials may be used for the cathode 5087.

Although not shown in the figure, it is possible that the light radiates upward in the case that the cathode is made thin.

Next, the protective electrode 5088 is formed overlapping the organic light emitting layer and the cathode. As a protective electrode 5088, the conductive layer, which contains aluminum as a main component, can be used. The protective electrode 5088 is formed using a vacuum deposition method with another mask when forming the organic light emitting layer and the cathode. Further, the protective electrode is formed continually without air release after forming the organic light emitting layer and the cathode.

Finally, a passivation film 5089 formed of silicon nitride film and having a thickness of 300 nm is formed. By forming the passivation film 5089, the protective electrode 5088 plays a role of protecting the organic light emitting layer from moisture or the like. Thus, reliability of the OLED can be further improved.

Accordingly, the active matrix type light emitting device having a structure shown in FIG. 15B is completed. Although in the manufacturing step of this embodiment, the signal line is formed by the materials Ta and W forming the gate, and the scanning line is formed by the wiring materials Al forming source/drain electrode because of the structure or the steps, other materials may be used.

The active matrix substrate in this embodiment has very high reliability and improved operating characteristics by arranging the TFTs of the optimal structures in a driving circuit portion in addition to the pixel portion and the controller. Further, in a crystallization process, crystallinity can be also improved by adding a metal catalyst such as Ni. Thus, a driving frequency of the signal line driving circuit can be set to 10 MHz or more.

First, the TFT having a structure for reducing hot carrier injection so as not to reduce an operating speed as much as possible is used as an n-channel type TFT of a CMOS circuit forming the driving circuit portion. Here, the driving circuit includes a shift register, a buffer, a level shifter, a latch in line sequential driving, a transmission gate in dot sequential driving, etc.

In the case of this embodiment, an active layer of the n-channel type TFT includes a source region, a drain region, a GOLD region, an LDD region, and channel forming region. The GOLD region is overlapped with the gate electrode through the gate insulating film.

Deterioration by the hot carrier injection in the p-channel type TFT of the CMOS circuit is almost negligible. Therefore, it is not necessary to particularly form the LDD region in this p-channel type TFT. However, similar to the n-channel type TFT, the LDD region can be formed in the p-channel type TFT as a hot carrier countermeasure.

Further, when the CMOS circuit for bi-directionally flowing an electric current through a channel forming region, i.e., the CMOS circuit in which roles of the source and drain regions are exchanged is used in the driving circuit, it is preferable for the n-channel type TFT that constitutes the CMOS circuit to form LDD regions such that the channel forming region is sandwiched between the LDD regions. As an example of this, a transmission gate used in the dot sequential driving is given. When a CMOS circuit required to reduce an OFF-state current value as much as possible is used in the driving circuit, the n-channel type TFT forming the CMOS circuit preferably has a structure that a portion of the LDD region overlaps a gate electrode. The transmission gate used in the dot sequential driving can be given also as an example as such.

In practice, the device reaching the state of FIG. 15B is packaged (enclosed) using a protective film that is highly airtight and allows little gas to transmit (such as a laminate film and a UV-curable resin film) or a light-transmissive sealing material, so as to further avoid exposure to the outside air. A space inside the seal may be set to an inert atmosphere or a hygroscopic substance (barium oxide, for example) may be placed there to improve the reliability of the light emitting element.

After securing the airtightness through packaging or other processing, a connector (flexible printed circuit: FPC) is attached for connecting an external signal terminal with a terminal led out from the elements or circuits formed on the substrate. The device in a state that can be shipped is called display device in this specification.

This embodiment can be freely combined with Embodiments 1 to 4.

[Embodiment 6]

Organic light emitting materials used in OLEDs are roughly divided into low molecular weight materials and high molecular weight materials. A light-emitting device of the present invention can employ a low molecular weight organic light emitting material and a high molecular weight organic light emitting material both.

A low molecular weight organic light emitting material is formed by an evaporation method. This makes it easy to form a laminate structure, and the efficiency is increased by layering films of different functions such as a hole transporting layer and an electron transporting layer. The hole transporting layer and the electron transporting layer are not necessarily exist clearly. A mixed state single layer or plural layers, for example as disclosed in Japanese Patent Application No. 2001-020817, may extend the operating lifetime of OLED and improve the light emitting efficiency.

Examples of low molecular weight organic light emitting material include an aluminum complex having quinolinol as a ligand ($Alq_3$) and a triphenylamine derivative (TPD).

On the other hand, a high molecular weight organic light emitting material is physically stronger than a low molecular weight material and enhances the durability of the element. Furthermore, a high molecular weight material can be formed by an application method and therefore manufacture of the element is relatively easy.

The structure of a light emitting element using a high molecular weight organic light emitting material is basically the same as the structure of a light emitting element using a low molecular weight organic light emitting material, and has a cathode, an organic light emitting layer, and an anode.

When an organic light emitting layer is formed from a high molecular weight organic light emitting material, a two-layer structure is popular among the known ones. This is because it is difficult to form a laminate structure using a high molecular weight material unlike the case of using a low molecular weight organic light emitting material. Specifically, an element using a high molecular weight organic light emitting material has a cathode, a light emitting layer, a hole transporting layer, and an anode. Ca may be employed as the cathode material in a light emitting element using a high molecular weight organic light emitting material.

The color of light emitted from an element is determined by the material of its light emitting layer. Therefore, a light emitting element that emits light of desired color can be formed by choosing an appropriate material. The high molecular weight organic light emitting material that can be used to form a light emitting layer is a polyparaphenylene vinylene-based material, a polyparaphenylene-based material, a polythiophen-based material, or a polyfluorene-based material.

The polyparaphenylene vinylene-based material is a derivative of poly(paraphenylene vinylene) (denoted by PPV), for example, poly(2,5-dialkoxy-1,4-phenylene vinylene) (denoted by RO-PPV), poly(2-(2'-ethyl-hexoxy)-5-metoxy-1,4-phenylene vinylene) (denoted by MEH-PPV), and poly(2-(dialkoxyphenyl)-1,4-phenylene vinylene) (denoted by ROPh-PPV).

The polyparaphenylene-based material is a derivative of polyparaphenylene (denoted by PPP), for example, poly(2,5-dialkoxy-1,4-phenylene) (denoted by RO-PPP) and poly(2,5-dihexoxy-1,4-phenylene).

The polythiophene-based material is a derivative of polythiophene (denoted by PT), for example, poly(3-alkylthiophene) (denoted by PAT), poly(3-hexylthiophene) (denoted by PHT), poly(3-cyclohexylthiophene) (denoted by PCHT), poly(3-cyclohexyl-4-methylthiophene) (denoted by PCHMT), poly(3,4-dicyclohexylthiophene) (denoted by PDCHT), poly[3-(4-octylphenyl)-thiophene] (denoted by POPT), and poly[3-(4-octylphenyl)-2,2 bithiophene] (denoted by PTOPT).

The polyfluorene-based material is a derivative of polyfluorene (denoted by PF), for example, poly(9,9-dialkylfluorene) (denoted by PDAF) and poly(9,9-dioctylfluorene) (denoted by PDOF).

If a layer that is formed of a high molecular weight organic light emitting material capable of transporting holes is sandwiched between an anode and a high molecular weight organic light emitting material layer that emits light, injection of holes from the anode is improved. This hole transporting material is generally dissolved into water together with an acceptor material, and the solution is applied by spin coating or the like. Since the hole transporting material is insoluble in an organic solvent, the film thereof can form a laminate with the above-mentioned organic light emitting material layer that emits light.

The high molecular weight organic light emitting material capable of transporting holes is obtained by mixing PEDOT with camphor sulfonic acid (denoted by CSA) that serves as the acceptor material. A mixture of polyaniline (denoted by PANI) and polystyrene sulfonic acid (denoted by PSS) that serves as the acceptor material may also be used.

Other than above-mentioned low molecular or high molecular organic light emitting material, an aggregate of an organic compound which does not have subliming property or dissolving property (preferably, an aggregate which has molecularity of 20 or less), or an organic compound which has a molecular chain length of 10 $\mu$m of less (preferably 50 nm or less), so-called an intermediate molecular weight organic light emitting material, may also be used.

The structure of this embodiment may be freely combined with any of the structures of Embodiments 1 through 5.

[Embodiment 7]

Figure 16:
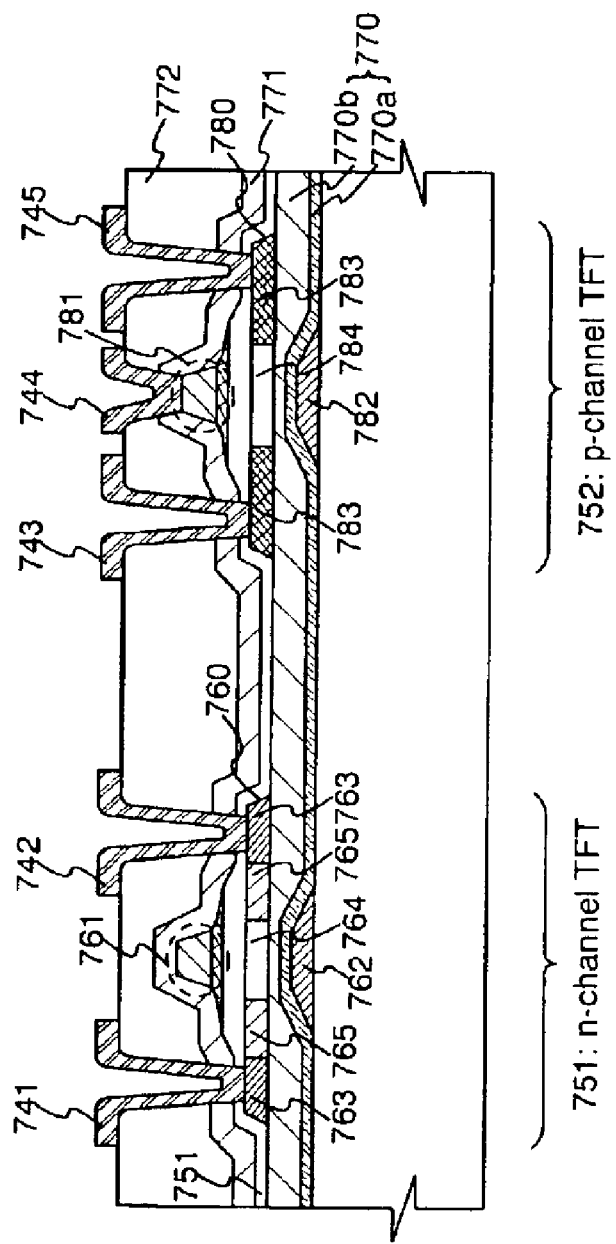
FIG. 16 is a view for showing a cross-sectional view of a TFT for using a controller of the present invention.

In this embodiment, a description will be made of a structure of a TFT used for a controller of the present invention. FIG. 16 is a sectional view showing an n-channel TFT 751 and a p-channel TFT 752 of this embodiment.

The n-channel TFT 751 includes a semiconductor film 760, a first electrode 762, a first insulating film 770, a second insulating film 751, and a second electrode 761. The semiconductor film 760 consists of one conductivity type impurity regions 763 with a first concentration, one conductivity type impurity regions 765 with a second concentration, and a channel formation region 764.

Note that, in this embodiment, the first insulating film 770 has a laminate structure composed of two insulating films 770a and 770b. However, the first insulating film 770 may be a single-layer insulating film or may have a laminate structure in which the insulating films are laminated in three or more layers.

The first electrode 762 and the channel formation region 764 overlap each other with the first insulating film 770 interposed therebetween. The second electrode 761 and the channel formation region 764 overlap each other with the second insulating film 751 interposed therebetween.

The p-channel TFT 752 includes a semiconductor film 780, a first electrode 782, a first insulating film 770, a second insulating film 751, and a second electrode 781. The semiconductor film 780 consists of one conductivity type impurity regions 783 with a third concentration and a channel formation region 784.

The first electrode 782 and the channel formation region 784 overlap each other with the first insulating film 770 interposed therebetween. The second electrode 781 and the channel formation region 784 overlap each other with the second insulating film 751 interposed therebetween.

Then, in this embodiment, although not shown, the first electrode 762 and the second electrode 761 are electrically connected. Also, the first electrode 782 and the second electrode 781 are electrically connected. Note that, the present invention is not limited to this structure, but may employ such a structure that the first electrode 762 and the second electrode 761 are electrically isolated from each other and a certain voltage is applied to the first electrode 762. Also, the present invention may employ such a structure that the first electrode 782 and the second electrode 781 are electrically isolated from each other and a certain voltage is applied to the first electrode 782.

Through the application of the given voltage to the first electrode, it is possible to reduce a variation in a threshold value and also an OFF current as compared with a case of single electrode. Further, to the first and second electrodes, a voltage at the same level is applied, so that a depletion layer spreads fast as in the case where the semiconductor film is substantially made thin. As a result, a subthreshold coefficient can be made small and further field effect mobility can be enhanced. Accordingly, it is possible to increase an ON current in comparison with the case of single electrode. Thus, by using the TFT with this structure for the driver circuits, a driving voltage can be lowered. Since the ON current can be increased, the TFTs can be reduced in size (particularly, in a channel width) to thereby enhance an integration density.

The n-channel TFT 751 and the p-channel TFT 752 are both covered with a first interlayer insulating film 771 and a second interlayer insulating film 772. According to the present invention, the n-channel TFT 751, the p-channel TFT 752, and the first interlayer insulating film 771 and the second interlayer insulating film 772 for covering the TFTs as described above can be manufactured before the specification of the controller is determined.

When the specification of the controller is determined, according to the specification of the controller, contact holes are formed in the first interlayer insulating film 771, the second interlayer insulating film 772, and the second insulating film to form wirings 741 to 745. The wirings 741 to 745 are connected to one of the impurity regions provided in the semiconductor films of the TFTs or the gate of the TFT. The number of the wirings and a layout thereof vary depending on the specification of the controller. In this embodiment, the wiring 741 is in contact with one of one conductivity type impurity regions 763 with a first concentration, whereas the wiring 742 is in contact with the other thereof. Also, the wiring 743 is in contact with one of one conductivity type impurity regions 783 with a third concentration, whereas the wiring 745 is in contact with the other thereof. The wiring 744 is in contact with a gate 781.

Note that, this embodiment can be implemented in combination with any one of Embodiments 1 to 6.

[Embodiment 8]

Figure 17A:
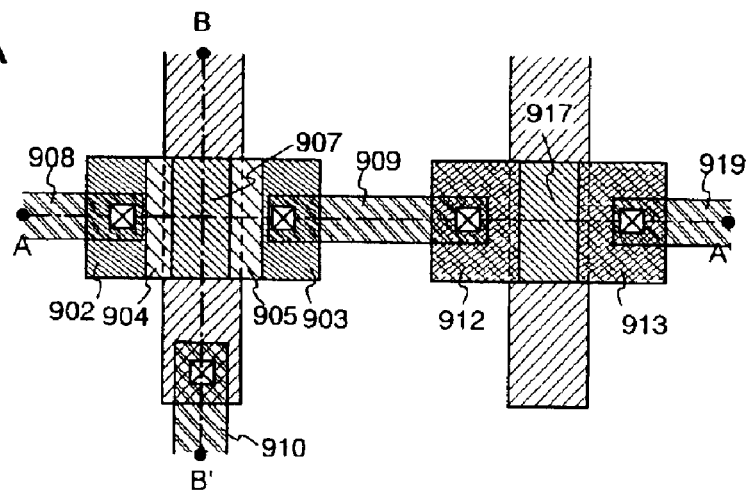
FIGS. 17A to 17C are views for showing a top surface view and a cross-sectional view of a TFT for using a controller of the present invention.
Figure 17B:
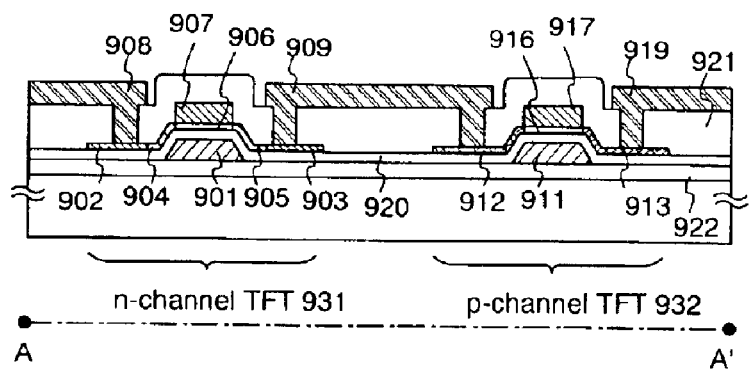
Figure 17C:
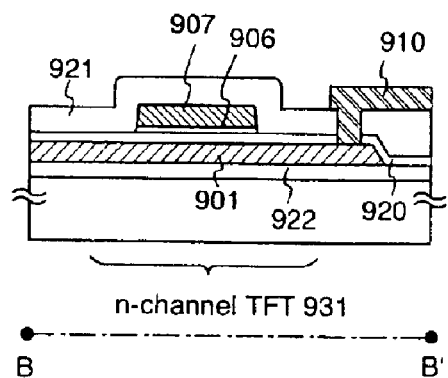

In this embodiment, a description will be made of a structure of a TFT used for a controller of the present invention. FIG. 17A is a top view showing an n-channel TFT 931 and a p-channel TFT 932 of this embodiment. FIGS. 17B and 17C are sectional views taken along the broken line A–A' and the broken line B–B' of FIG. 17A, respectively.

In FIGS. 17A to 17C, the n-channel TFT 931 includes, on an insulating film 922 serving as a base (hereinafter, referred to as a base film), a gate 901, a gate insulating film 920 contacting the gate 901, and an active layer contacting the gate insulating film 920. Here, the active layer includes a channel formation region 906, impurity regions 902 and 903 sandwiching the channel formation region 906 therebetween, and LDD regions 904 and 905 that are formed between the channel formation region 906 and the impurity regions 902 and 903, respectively. Denoted by 907 is a protective film for protecting the channel formation region 906.

The p-channel TFT 932 includes, on the base film 922, a gate 911, the gate insulating film 920 contacting the gate 911, and an active layer contacting the gate insulating film 920. Here, the active layer includes a channel formation region 916, and impurity regions 912 and 913 sandwiching the channel formation region 916 therebetween. Denoted by 917 is a protective film for protecting the channel formation region 916.

The n-channel TFT 931 and the p-channel TFT 932 are both covered with a first interlayer insulating film 921. According to the present invention, the n-channel TFT 931, the p-channel TFT 932, and the first interlayer insulating film 921 covering the TFTs can be manufactured before determining the specification of the controller.

When the specification of the controller is determined, according to the specification of the controller, contact holes are formed in the first interlayer insulating film 921 and the gate insulating film 920 to form wirings 908, 909, 910, and 919. The wirings 908, 909, 910, and 919 are connected to any of the impurity regions provided in the semiconductor films of the TFTs or the gate of the TFT. The number of the wirings and a layout thereof vary depending on the specification of the controller. In this embodiment, the wiring 908 is in contact with the impurity region 902 and the wiring 909 is in contact with the impurity regions 903 and 912. Also, the wirings 919 and 910 are electrically connected to the impurity region 913 and the gate 901, respectively.

Here, the gate insulating film 920 or the first interlayer insulating film 921 may be formed commonly to all the TFTs on the substrate or may be different depending on the circuit or element.

Note that, the structure of this embodiment can be implemented freely in combination with Embodiments 1 to 6.

[Embodiment 9]

The following description on this embodiment refers to the constitution of a pixel utilizing a cathode as a pixel electrode.

Figure 18:
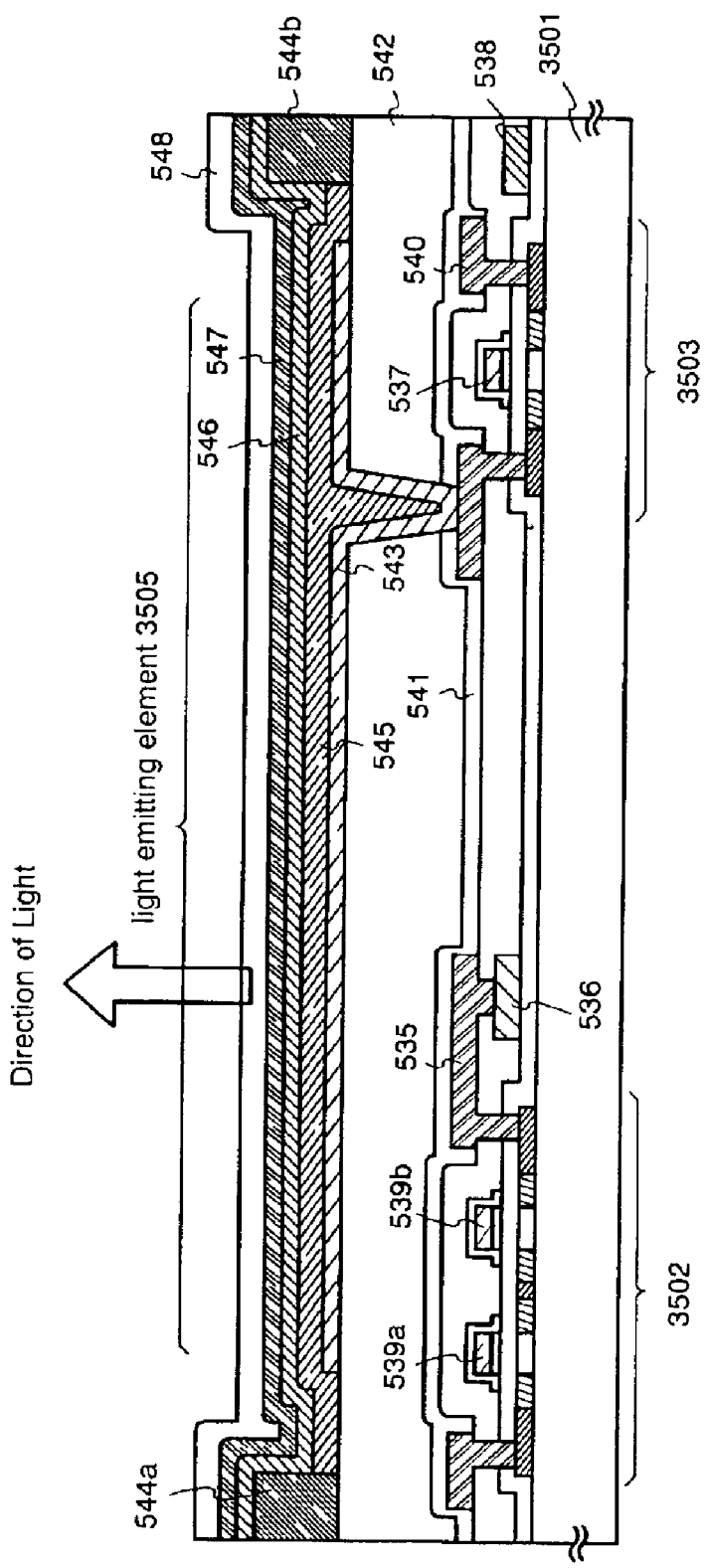
FIG. 18 is a view for showing a cross sectional view of a light emitting device of the present invention.

FIG. 18 exemplifies a cross-sectional view of a pixel according to this embodiment. In FIG. 18, an n-channel type TFT 3502 manufactured on a substrate 3501 is manufactured by applying a known method. In this embodiment, an n-channel type TFT 3502 based on the double-gate structure is used. However, it is also practicable to employ a single-gate structure, or a triple-gate structure, or a multiple-gate structure incorporating more than three of gate electrodes. To simplify the illustration, only n-channel type TFTs having pixels and p-channel type TFTs controlling current fed to pixel electrodes are illustrated, other TFTs can also be manufactured by referring to the structures shown in FIG. 18.

A p-channel type TFT 3503 corresponds to an n-channel TFT, and can be manufactured by applying a known method. A wiring designated by reference numeral 538 corresponds to a scanning line for electrically linking a gate electrode 539a of the above n-channel type TFT 3502 with the other gate electrode 539b thereof.

In this embodiment, the above p-channel type TFT 3503 is exemplified as having a single-gate structure. However, the p-channel type TFT may have a multiple-gate structure in which a plurality of TFTs are connected in series with each other. Further, such a structure may also be introduced, which substantially splits a channel-formation region into plural parts connecting a plurality of TFTs in parallel with each other, thereby enabling them to radiate heat with higher efficiency. This construction is quite effective to cope with thermal degradation of the TFTs.

A first interlayer insulating film 541 is formed on the n-channel type TFT 3502 and p-channel type 3503. Further, a second interlayer insulating film 542 made of resinous insulating film is formed on the first interlayer insulating film 541. It is extremely important to fully level off steps produced by provision of TFTs by utilizing the second interlayer insulating film 542. This is because, since organic light emitting layers to be formed later on are extremely thin, since presence of such steps may cause faulty light emission to occur. Taking this into consideration, before forming the pixel electrode, it is desired that the above-referred steps be leveled off as much as possible so that the organic light emitting layers can be formed on a fully leveled surface.

Reference numeral 543 designates a pixel electrode, i.e., a cathode electrode provided for the light emitting element, composed of a highly reflective electrically conductive film. The pixel electrode 543 is electrically connected to the drain region of the p-channel type TFT 3503. For the pixel electrode 543, it is desired to use an electrically conductive film having a low resistance value such as an aluminum alloy film, a copper alloy film, or a silver alloy film, or a laminate of these alloy films. It is of course practicable to utilize such a construction that employs a laminate comprising the above-referred alloy films combined with other kinds of metallic films bearing electrical conductivity.

A light emitting layer 545 is formed inside of a groove (this corresponds to a pixel) produced between a pair of banks 544a and 544b which are made from resinous insulating films (preferably resin). Although only one pixel is shown here, it is also practicable to separately form a plurality of light emitting layers respectively corresponding to three colors of red, green, and blue. Organic light emitting material such as π-conjugate polymer material is utilized to compose the light emitting layers. Typically, available polymer materials include the following: polyparaphenylene vinyl (PPV), polyvinyl carbazol (PVK), and polyfluorene, for example.

There are a wide variety of organic light emitting materials comprising the above-referred PPV. For example, such materials cited in the following publications may be used: H. Shenk, H. Becker, O. Gelsen, E. Kluge, W. Spreitzer "Polymers for Light Emitting Diodes", Euro Display, Proceedings, 1999, pp. 33–37, and such material, set forth in the JP 10-92576.

As a specific example of the above-referred light emitting layers, there may be used cyano-polyphenylene-vinylene for composing a layer for emitting red light; polyphenylene-vinylene for composing a layer for emitting green light; and polyphnylene or polyalkylphenylene for composing a layer for emitting blue light. It is suggested that the thickness of an individual light emitting layer shall be defined in a range of from 30 nm to 150 nm, preferably in a range of from 40 nm to 100 nm.

The above description, however, has solely referred to a typical example of organic light emitting materials available for composing light emitting layers, and thus, applicable organic light emitting materials are not necessarily limited to those which are cited above. Thus, organic light emitting layers (layers for enabling light emission as well as movement of carriers therefore) freely combining light emitting layers, electron transporting layers, and electron injecting layers with each other.

For example, this embodiment has exemplified such a case in which polymer materials are utilized for composing light emitting layers. However, it is also possible to utilize low molecular weight organic light emitting materials, for example. To compose a electron transporting layer and a electron injecting layer, it is also possible to utilize inorganic materials such as silicon carbide for example. Conventionally known materials may be used as the organic light emitting materials and the inorganic light emitting materials.

In this embodiment, organic light emitting layers having a laminate structure are formed, in which a hole injection layer 546 made from polythiophene (PEDOT) or polyaniline (PAni) is formed on the light emitting layer 545. An anode electrode 547 composed of a transparent electrically conductive film is formed on the hole injection layer 546. In this embodiment, light generated by the light emitting layers 545 is radiant in the direction of the upper surface of the TFT. Because of this, the anode electrode 547 must be transparent to the light. To form a transparent electrically conductive film, a compound comprising indium oxide and tin dioxide or a compound comprising indium oxide and zinc oxide may be utilized. However, since the transparent electrically conductive film is formed after completing formation of the light emitting layer 545 and the hole injection layer 546 both having poor heat-resisting property, it is desired that the anode electrode 547 be formed at a low temperature as possible.

Upon completion of the formation of the anode electrode 547, the light emitting element 3505 is completed. Here, the light emitting element 3505 is provided with the pixel electrode (cathode electrode) 543, the light emitting layers 545, the hole injection layer 546, and the anode electrode 547. Since the area of the pixel electrode 543 substantially coincides with the total area of the pixel, the entire pixel functions itself as a light emitting element. Accordingly, an extremely high light-emitting efficiency is attained in practical use, thereby making it possible to display an image with high luminance.

This embodiment further provides a second passivation film 548 on the anode electrode 547. It is desired that silicon nitride or silicon oxynitride be utilized for composing the second passivation film 548. The second passivation film 48 shields the light emitting element 3505 from the external in order to prevent unwanted degradation thereof caused by oxidation of the organic light emitting material and also prevent gas component from leaving the organic light emitting material. By virtue of the above arrangement, reliability of the light emitting device is enhanced furthermore.

As described above, the light emitting device of the present invention shown in FIG. 18 includes pixel portions each having the constitution as exemplified therein. In particular, the light emitting device utilizes the TFT 3502 with a sufficiently a low OFF current value and the TFT 3503 capable of fully withstanding injection of hot carriers. Because of these advantageous features, the light emitting device has enhanced reliability and can display clear image.

Incidentally, the structure of Embodiment 9 can be implemented by freely combining with the structure of Embodiments 1 to 6.

[Embodiment 10]

Figure 19A:
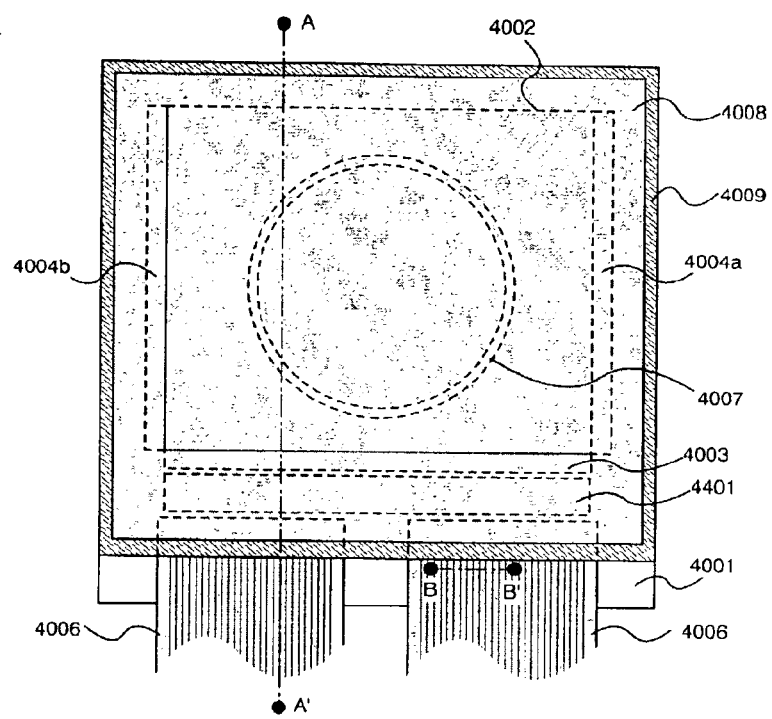
FIGS. 19A to 19C are views for showing an external view and a cross-sectional view of a light emitting device of the present invention.
Figure 19B:
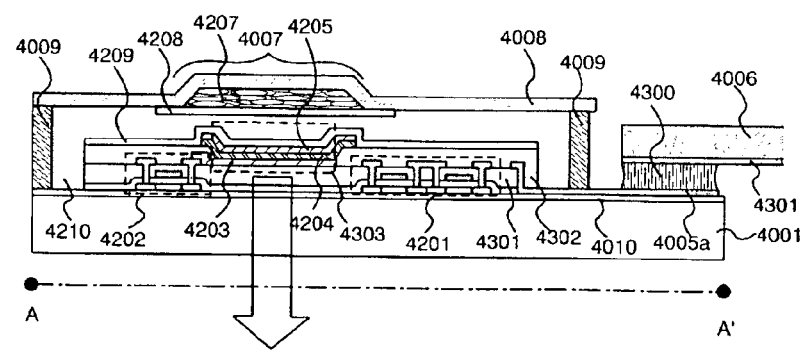
Figure 19C:
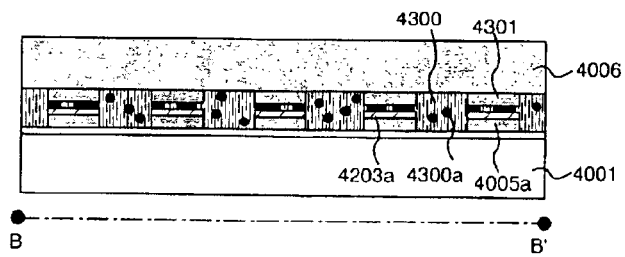

In Embodiment 10, the constitution of the light emitting device of the present invention is described with FIG. 19. FIG. 19 is a top view of the light-emitting device, FIG. 19B is a cross sectional view taken along with a line A–A' of FIG. 19A, and FIG. 19C is a cross sectional view taken along with a line B–B' of FIG. 19A.

A seal member 4009 is provided so as to surround a pixel portion 4002, a signal line driver circuit 4003, the first, second scanning line driver circuits 4004a, 4004b, and the controller 4401 which are provided on a substrate 4001. Further, a sealing material 4008 is provided on the pixel portion 4002, the signal line driver circuit 4003, the first, the second scanning line driver circuits 4004a, 4004b, and the controller 4401. Thus, the pixel portion 4002, the signal line driver circuit 4003, the first, the second scanning line driver circuits 4004a, 4004b, and the controller 4401 are sealed by the substrate 4001, the seal member 4009 and the sealing material 4008 together with a filler 4210.

Further, the pixel portion 4002, the signal line driver circuit 4003, the first, the second scanning line driver circuits 4004a, 4004b, and the controller 4401 which are provided on the substrate 4001, have a plurality of TFTs. In FIG. 19B, a driver circuit TFT (Here, an n-channel TFT and a p-channel TFT are shown in the figure.) 4201 included in the signal line driver circuit 4003 and a current control TFT 4202 included in the pixel portion 4002, which are formed on a base film 4010, are typically shown.

In this embodiment, the p-channel TFT or the n-channel TFT manufactured by a known method is used as the driving TFT 4201, and the p-channel TFT manufactured by a known method is used as the current control TFT 4202. The retention capacitor (not illustrated) that is connected to the gate electrode of the current control TFT 4202 is provided in the pixel portion 4002.

An interlayer insulating film (leveling film) 4301 is formed on the driving TFT 4201 and the current control TFT 4202, and a pixel electrode (anode) 4203 electrically connected to a drain of the current control TFT 4202 is formed thereon. A transparent conductive film having a large work function is used for the pixel electrode 4203. A compound of indium oxide and tin oxide, a compound of indium oxide and zinc oxide, zinc oxide, tin oxide or indium oxide can be used for the transparent conductive film. The above transparent conductive film added with gallium may also be used.

Then, an insulating film 4302 is formed on the pixel electrode 4203, and the insulating film 4302 is formed with an opening portion on the pixel electrode 4203. In this opening portion, an organic light-emitting layer 4204 is formed on the pixel electrode 4203. A known organic light-emitting material or inorganic light-emitting material may be used for the organic light-emitting layer 4204. Further, there exist a low molecular weight (monomer) material and a high molecular weight (polymer) material as the organic light-emitting materials, and both the materials may be used.

A known evaporation technique or application technique may be used as a method of forming the organic light-emitting layer 4204. Further, the structure of the organic light-emitting layer may take a lamination structure or a single layer structure by freely combining a hole injecting layer, a hole transporting layer, a light-emitting layer, an electron transporting layer and an electron injecting layer.

A cathode 4205 made of a conductive film having light-shielding property (typically, conductive film containing aluminum, copper or silver as its main constituent or lamination film of the above conductive film and another conductive film) is formed on the organic light-emitting layer 4204. Further, it is desirable that moisture and oxygen that exist on an interface of the cathode 4205 and the organic light-emitting layer 4204 are removed as much as possible. Therefore, such a device is necessary that the organic light-emitting layer 4204 is formed in a nitrogen or rare gas atmosphere, and then, the cathode 4205 is formed without exposure to oxygen and moisture. In this embodiment, the above-described film deposition is enabled by using a multi-chamber type (cluster tool type) film forming device. In addition, a predetermined voltage is given to the cathode 4205.

As described above, an OLED 4303 constituted of the pixel electrode (anode) 4203, the organic light-emitting layer 4204 and the cathode 4205 is formed. Further, a protective film 4303 is formed on the insulating film 4302 so as to cover the light emitting element 4303. The protective film 4303 is effective in preventing oxygen, moisture and the like from permeating the light emitting element 4303.

Reference symbol 4005a denotes a wiring drawn to be connected to the power supply line, and the wiring 4005a is electrically connected to a source region of the controller 4202. The drawn wiring 4005a passes between the seal member 4009 and the substrate 4001, and is electrically connected to an FPC wiring 4301 of an FPC 4006 through an anisotropic conductive film 4300.

A glass material, a metal material (typically, stainless material), a ceramics material or a plastic material (including a plastic film) can be used for the sealing material 4008. As the plastic material, an FRP (fiberglass-reinforced plastics) plate, a PVF (polyvinyl fluoride) film, a Mylar film, a polyester film or an acrylic resin film may be used. Further, a sheet with a structure in which an aluminum foil is sandwiched with the PVF film or the Mylar film can also be used.

However, in the case where the light from the OLED is emitted toward the cover member side, the cover member needs to be transparent. In this case, a transparent substance such as a glass plate, a plastic plate, a polyester film or an acrylic film is used.

Further, in addition to an inert gas such as nitrogen or argon, an ultraviolet curable resin or a thermosetting resin may be used as the filler 4210, so that PVC (polyvinyl chloride), acrylic, polyimide, epoxy resin, silicone resin, PVB (polyvinyl butyral) or EVA (ethylene vinyl acetate) can be used. In this embodiment, nitrogen is used for the filler.

Moreover, a concave portion 4007 is provided on the surface of the sealing material 4008 on the substrate 4001 side, and a hygroscopic substance or a substance that can absorb oxygen 4207 is arranged therein in order that the filler 4210 is made to be exposed to the hygroscopic substance (preferably, barium oxide) or the substance that can absorb oxygen. Then, the hygroscopic substance or the substance that can absorb oxygen 4207 is held in the concave portion 4007 by a concave portion cover member 4208 such that the hygroscopic substance or the substance that can absorb oxygen 4207 is not scattered. Note that the concave portion cover member 4208 has a fine mesh form, and has a structure in which air and moisture are penetrated while the hygroscopic substance or the substance that can absorb oxygen 4207 is not penetrated. The deterioration of the OLED 4303 can be suppressed by providing the hygroscopic substance or the substance that can absorb oxygen 4207.

As shown in FIG. 19C, the pixel electrode 4203 is formed, and at the same time, a conductive film 4203a is formed so as to contact the drawn wiring 4005a.

Further, the anisotropic conductive film 4300 has conductive filler 4300a. The conductive film 4203a on the substrate 4001 and the FPC wiring 4301 on the FPC 4006 are electrically connected to each other by the conductive filler 4300a by heat-pressing the substrate 4001 and the FPC 4006.

Note that the structure of this embodiment can be implemented by being freely combined with the structures shown in Embodiment 1 through 9.

[Embodiment 11]

Electronic devices using a semiconductor display device of the present invention include a video camera, a digital camera, a goggles-type display (head mount display), a navigation system, a sound reproduction device (a car audio equipment and an audio set), a lap-top computer, a game machine, a portable information terminal (a mobile computer, a mobile phone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. FIG. 20 respectively shows various specific examples of such electronic devices.

Figure 20A:
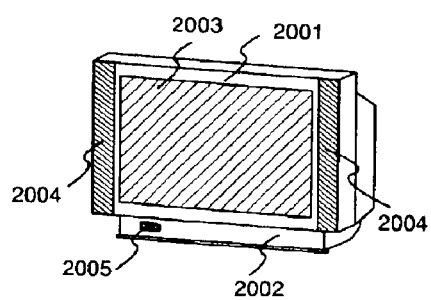
FIGS. 20A to 20H are views for showing electronic apparatuses using a semiconductor device of the present invention.

FIG. 20A illustrates an light emitting display device which includes a casing 2001, a support table 2002, a display portion 2003, a speaker portion 2004, a video input terminal 2005 or the like. The present invention is applicable to the display portion 2003. The light-emitting device is of the self-emission type and therefore requires no backlight. Thus, the display portion thereof can have a thickness thinner than that of the liquid crystal display device. The light emitting display device is including the entire display device for displaying information, such as a personal computer, a receiver of TV broadcasting and an advertising display.

Figure 20B:
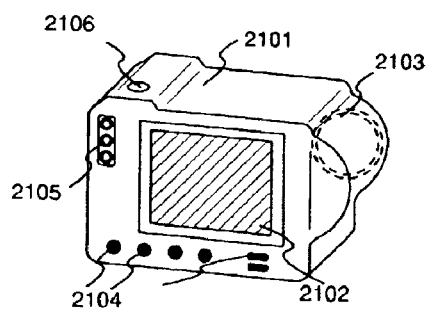

FIG. 20B illustrated a digital still camera which includes a main body 2101, a display portion 2102, an image receiving portion 2103, an operation key 2104, an external connection port 2105, a shutter 2106, or the like. The digital still camera of the present invention is completed by using the semiconductor display device in accordance with the present invention as the display portion 2102.

Figure 20C:
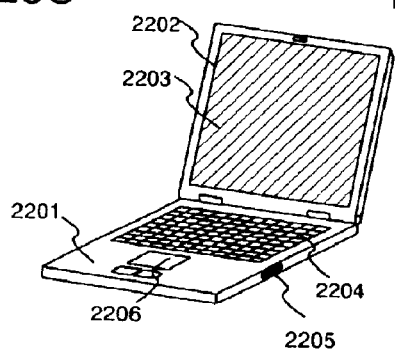

FIG. 20C illustrates a notebook type computer which includes a main body 2201, a casing 2202, a display portion 2203, a keyboard 2204, an external connection port 2205, a pointing mouse 2206, or the like. The lap-top computer is completed by using the semiconductor display device in accordance with the present invention as the display portion 2203.

Figure 20D:
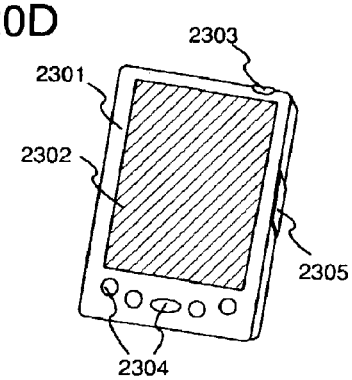

FIG. 20D illustrated a mobile computer which includes a main body 2301, a display portion 2302, a switch 2303, an operation key 2304, an infrared port 2305, or the like. The mobile computer is completed by using the semiconductor display device in accordance with the present invention as the display portion 2302.

Figure 20E:
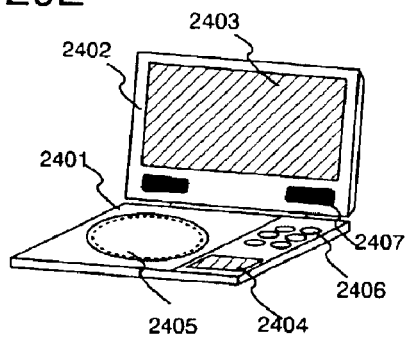

FIG. 20E illustrates a portable image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The image reproduction apparatus including a recording medium further includes a game machine or the like. The image reproduction apparatus is completed by using the semiconductor display device in accordance with the present invention as these display portions A 2403 and B 2404.

Figure 20F:
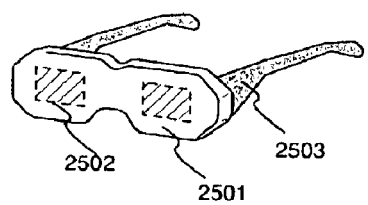

FIG. 20F illustrates a goggle type display (head mounted display) which includes a main body 2501, a display portion 2502, arm portion 2503 or the like. The goggle type display is completed by using the semiconductor display device in accordance with the present invention as the display portion 2502.

Figure 20G:
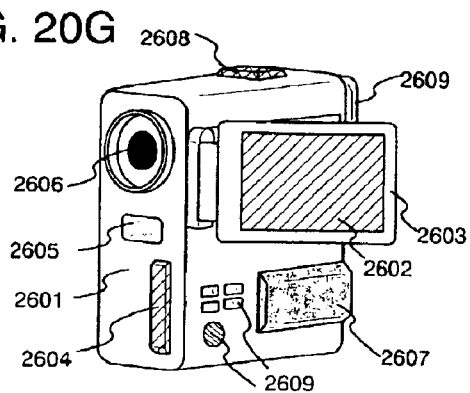

FIG. 20G illustrates a video camera which includes a main body 2601, a display portion 2602, a casing 2603, an external connecting port 2604, a remote control receiving portion 2605, an image receiving portion 2606, a battery 2607, a sound input portion 2608, an operation key 2609, or the like. The video camera is completed by using the semiconductor display device in accordance with the present invention as the display portion 2602.

Figure 20H:
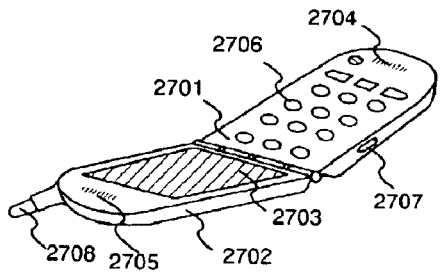

FIG. 20H illustrates a portable telephone which includes a main body 2701, a casing 2702, a display portion 2703, a sound input portion 2704, a sound output portion 2705, an operation key 2706, an external connecting port 2707, an antenna 2708, or the like. Note that the display portion 2703 can reduce power consumption of the mobile telephone by displaying white-colored characters on a black-colored background. The mobile phone is complete by using the semiconductor display device in accordance with the present invention can be used as the display portion 2703.

When the brighter luminance of light emitted from the organic light-emitting material becomes available in the future, the light-emitting device in accordance with the present invention will be applicable to a front-type or rear-type projector in which light including output image information is enlarged by means of lenses or the like to be projected.

The electronic apparatus of the present invention may be completed by using the controller in accordance with the present invention as the signal control circuit or the like.

As set forth above, the present invention can be applied variously to a wide range of electronic devices in all fields. The electronic device in this embodiment can be obtained by utilizing a light emitting device having the structure in which the structures in Embodiment 1 through 10 are freely combined.

In the present invention, the controller using TFT is designed as in the case of ASIC, thereby, when the specification of the controller is changed, it is enough to change only a design of the wirings connecting the TFTs or the logic elements formed in advance, so that at least two masks: a mask for patterning the wiring; and a mask for a contact hole of the wiring may be changed. Therefore, it is possible to reduce a cost associated with a design change of the controller and also to manufacture the controllers of the various specifications.

What is claimed is:

1. A designing method for a semiconductor display device comprising a controller, the method comprising:

forming a plurality of TFTs over a substrate;

forming a plurality of logic elements by connecting through wiring sources, drains, or gates with each other in some of a plurality of TFTs, there being at least one unused TFT; and forming the controller by using the plurality of logic elements.

2. A designing method for a semiconductor display device comprising a controller, the method comprising:

forming a plurality of basic cells comprising a plurality of TFTs in which any of sources, drains, and gates are connected to each other;

forming a plurality of logic elements by connecting through wiring the sources, the drains, or the gates with each other in some of the TFTs in each of the basic cells, there being at least one unused TFT; and forming the controller by using the plurality of logic elements.

3. A designing method for a semiconductor display device comprising a controller, the method comprising:

forming a plurality of logic elements comprising a plurality of TFTs; and forming the controller by connecting terminals in some of the plurality of logic elements through wiring, there being at least one unused TFT.

4. A designing method for a semiconductor display device comprising a controller, the method comprising:

forming a plurality of TFTs over a substrate;

forming an interlayer insulating film covering the plurality of TFTs;

etching the interlayer insulating film to expose at least one of a source, a drain, and a gate in some of the plurality of TFTs;

forming a conductive film so as to cover the interlayer insulating film;

etching the conductive film to form a wiring for connecting any of the sources, the drains, and the gates with each other in said some of the TFTs;

forming a plurality of logic elements through formation of the wiring; and forming the controller by using the plurality of logic elements.

5. A designing method for a semiconductor display device comprising a controller, the method comprising:

forming a plurality of basic cells comprising a plurality of TFTs in which any of sources, drains, and gates are connected with each other;

etching an interlayer insulating film covering the basic cells to expose at least one of the source, the drain, and the gate in some of the plurality of TFTs;

forming a conductive film so as to cover the interlayer insulating film;

etching the conductive film to form a wiring for connecting any of the sources, the drains, and the gates with each other in said some of the TFTs;

forming a plurality of logic elements through formation of the wiring; and forming the controller by using the plurality of logic elements.

6. A method for manufacturing a semiconductor display device comprising a controller, the method comprising:

forming a plurality of TFTs;

forming a plurality of logic elements by connecting through wiring sources, drains, or gates with each other in some of the plurality of TFTs, there being at least one unused TFT; and forming the controller by using the plurality of logic elements.

7. A method for manufacturing a semiconductor display device comprising a controller, the method comprising:

forming a plurality of basic cells comprising a plurality of TFTs in which any of sources, drains, and gates are connected with each other;

forming a plurality of logic elements by connecting through wiring the sources, the drains, or the gates with each other in some of the TFTs in each of the basic cells, there being at least one unused TFT; and forming the controller by using the plurality of logic elements.

8. A method for manufacturing a semiconductor display device comprising a controller, the method comprising:

forming a plurality of logic elements comprising a plurality of TFTs; and forming the controller by connecting terminals in some of the plurality of logic elements through wiring, there being at least one unused TFT.

9. A method for manufacturing a semiconductor display device comprising a controller, the method comprising:

forming a plurality of TFTs;

etching an interlayer insulating film covering the plurality of TFTs to expose at least one of a source, a drain, and a gate in some of the plurality of TFTs;

forming a conductive film so as to cover the interlayer insulating film;

etching the conductive film to form a wiring for connecting the sources, the drains, or the gates with each other in said some of the TFTs;

forming a plurality of logic elements through formation of the wiring; and forming the controller by using the plurality of logic elements.

10. A method for manufacturing a semiconductor display device comprising a controller, the method comprising:

forming a basic cell comprising a plurality of TFTs in which any of sources, drains, and gates are connected with each other;

etching an interlayer insulating film covering the basic cell to expose at least one of the source, the drain, and the gate in some of the plurality of TFTs;

forming a conductive film so as to cover the interlayer insulating film;

etching the conductive film to form a wiring for connecting the sources, the drains, or the gates with each other in said some of the TFTs;

forming a plurality of logic elements through formation of the wiring; and forming the controller by using the plurality of logic elements.

11. A method for manufacturing a semiconductor display device comprising a controller, the method comprising:

forming a plurality of wirings on an insulating surface;

forming a base film in contact with the plurality of wirings;

partially etching the base film to expose a portion of the plurality of wirings;

forming a semiconductor film covering the base film so as to contact the plurality of wirings;

forming a gate insulating film in contact with the semiconductor film;

partially etching the gate insulating film and the base film to expose a portion of the plurality of wirings;

forming a conductive film so as to cover the gate insulating film and etching the conductive film to form an electrode contacting the plurality of wirings;

adding an impurity for imparting a conductivity type to the semiconductor film;

forming a plurality of logic elements by controlling a layout for the plurality of wirings; and forming the controller by using the plurality of logic elements.

12. A method for manufacturing a plurality of semiconductor display devices each comprising a controller, the method comprising:

providing at least two substrates;

forming a plurality of TFTs over each of said at least two substrates in a first common process;

forming a first plurality of logic elements by connecting sources, drains, or gates with each other through wiring in some of the plurality of TFTs in one of said at least two substrates;

forming a second plurality of logic elements by connecting sources, drains, or gates with each other through wiring in some of the plurality of TFTs in another one of said at least two substrates; and processing said at least two substrates in a second common process, wherein said first and said second plurality of logic elements are formed by different processes.

13. A method according to any one of claims 1–12, wherein the semiconductor display device is incorporated in at least one selected from the group consisting of a light emitting display device, digital camera, a notebook type computer, a mobile computer, an image reproduction apparatus, a goggle type display, a video camera, and a portable telephone.

* * * * *